(12) United States Patent
Jang

(10) Patent No.: US 8,842,803 B2
(45) Date of Patent: Sep. 23, 2014

(54) SHIFT REGISTER

(71) Applicant: LG Display Co., Ltd., Seoul (KR)

(72) Inventor: Yong-Ho Jang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/721,336

(22) Filed: Dec. 20, 2012

(65) Prior Publication Data

US 2014/0044228 A1 Feb. 13, 2014

(30) Foreign Application Priority Data

Aug. 8, 2012 (KR) .................. 10-2012-0086575

(51) Int. Cl.
*G11C 19/00* (2006.01)
*G09G 3/36* (2006.01)
*G11C 19/28* (2006.01)
*G09G 3/20* (2006.01)
(52) U.S. Cl.
CPC .... *G11C 19/00* (2013.01); *G09G 3/36* (2013.01); *G11C 19/28* (2013.01); *G09G 3/20* (2013.01)
USPC ................ 377/64; 377/69; 377/77; 377/78
(58) Field of Classification Search
None
See application file for complete search history.

(56) References Cited

U.S. PATENT DOCUMENTS

| 8,085,235 | B2* | 12/2011 | Jeon et al. ............... 345/100 |
| 8,515,000 | B2* | 8/2013 | Yang et al. ............... 377/64 |
| 2006/0210012 | A1* | 9/2006 | Yamaguchi et al. ........ 377/64 |
| 2008/0055225 | A1* | 3/2008 | Pak et al. ............... 345/96 |
| 2008/0191993 | A1* | 8/2008 | Chiang et al. ............. 345/100 |
| 2009/0010379 | A1* | 1/2009 | Chiang et al. ............. 377/64 |
| 2012/0105338 | A1* | 5/2012 | Lin et al. ............... 345/173 |
| 2013/0100007 | A1* | 4/2013 | Yamamoto et al. ......... 345/100 |
| 2013/0249884 | A1* | 9/2013 | Kim et al. ............... 345/212 |
| 2013/0301793 | A1* | 11/2013 | Tobita ............... 377/64 |

* cited by examiner

*Primary Examiner* — Tuan T Lam

(74) *Attorney, Agent, or Firm* — Morgan, Lewis & Bockius LLP

(57) ABSTRACT

Disclosed herein is a shift register which is capable of preventing leakage of charges at a set node which occurs when the duty ratio of a scan pulse is small, so as to normally output a scan pulse. The shift register includes a plurality of stages for sequentially generating outputs thereof. Each of the stages includes a carry output unit for outputting a carry pulse to drive at least one of a downstream stage and an upstream stage, and a scan output unit for outputting a scan pulse to drive a gate line. Each of the outputs generated from the stages includes the carry pulse and the scan pulse. The carry pulse and the scan pulse are paired to correspond to each other. The paired carry pulse and scan pulse have different durations.

19 Claims, 15 Drawing Sheets

SHIFT REGISTER

This application claims the benefit of Korean Patent Application No. 10-2012-0086575, filed on Aug. 8, 2012, which is hereby incorporated by reference as if fully set forth herein.

BACKGROUND OF THE INVENTION

1. Field of the Invention

The present invention relates to a shift register, and more particularly, to a shift register which is capable of preventing leakage of charges at a set node which occurs when the duty ratio of a scan pulse is small, so as to normally output a scan pulse.

2. Discussion of the Related Art

A shift register outputs a plurality of scan pulses in order to sequentially drive gate lines of a display device, such as a liquid crystal display.

A scan pulse has a duty ratio that can be set appropriately according to a given driving condition. In particular, when the duty ratio of the scan pulse is smaller, a duration in which the scan pulse is kept low (referred to hereinafter as a low duration) is longer. As a result, in this low duration, the possibility that charges at a set node of a stage will be leaked is higher. For this reason, there may occur a problem that the scan pulse is not normally output in an output period of the stage.

SUMMARY OF THE INVENTION

Accordingly, the present invention is directed to a shift register that substantially obviates one or more problems due to limitations and disadvantages of the related art.

An object of the present invention is to provide a shift register which generates a carry pulse using a carry clock pulse, which is kept high for a longer time than a scan clock pulse, and turns on a specific switching device for a sufficient time including a low duration between scan pulses using the carry pulse, so as to prevent leakage of charges at a set node.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register includes a plurality of stages for sequentially generating outputs thereof, wherein each of the stages includes a carry output unit for outputting a carry pulse to drive at least one of a downstream stage and an upstream stage, and a scan output unit for outputting a scan pulse to drive a gate line, wherein each of the outputs generated from the stages includes the carry pulse and the scan pulse, the carry pulse and the scan pulse being paired to correspond to each other, wherein the paired carry pulse and scan pulse have different durations.

The duration of the carry pulse may be longer than the duration of the scan pulse.

Each of the stages may receive at least one of i carry clock pulses, the i carry clock pulses being out of phase with one another, and at least one of j scan clock pulses, the j scan clock pulses being out of phase with one another, wherein the carry output unit of each of the stages may generate and output the carry pulse based on the at least one carry clock pulse, and wherein the scan output unit of each of the stages may generate and output the scan pulse based on the at least one scan clock pulse.

Each of the i carry clock pulses may include a plurality of carry impulses, the carry impulses being periodically output, and each of the j scan clock pulses may include a plurality of scan impulses, the scan impulses being periodically output, wherein the scan impulses in each of the j scan clock pulses may be synchronized with carry impulses in at least one of the i carry clock pulses, respectively.

Each scan impulse in a scan clock pulse output in the kth order (where k is any one of natural numbers from 1 to j), among the j scan clock pulses, may be synchronized with a carry impulse output in the (jm+k)th order (where m is a natural number including 0), among the carry impulses in the i carry clock pulses.

Each of the carry impulses may have a duration longer than that of each of the scan impulses.

In a carry impulse and a scan impulse synchronized with each other, the carry impulse may have a rising edge being ahead of or behind that of the scan impulse or coinciding with that of the scan impulse, and a falling edge being behind that of the scan impulse.

Each of the stages may further include a set node, a reset node, a scan output terminal, a carry output terminal, and a node controller for controlling voltages at the set node and reset node in response to a carry pulse from the upstream stage and a carry pulse from the downstream stage, wherein the carry output unit of each of the stages may include a carry pull-up switching device controlled by the voltage at the set node and connected between a carry clock transfer line, the carry clock transfer line transferring any one of the carry clock pulses, and the carry output terminal, and wherein the scan output unit of each of the stages may include a scan pull-up switching device controlled by the voltage at the set node and connected between a scan clock transfer line, the scan clock transfer line transferring any one of the scan clock pulses, and the scan output terminal.

Each of the stages may further include a capacitor connected between the set node and the carry output terminal.

The carry output unit of each of the stages may further include a carry pull-down switching device controlled by the voltage at the reset node or any one of the carry clock pulses and connected between the carry output terminal and a second discharging voltage line, the second discharging voltage line transferring a second discharging voltage.

The scan output unit of each of the stages may further include a scan pull-down switching device controlled by the voltage at the reset node and connected between the scan output terminal and a first discharging voltage line, the first discharging voltage line transferring a first discharging voltage.

The node controller of each of the stages may include a first switching device controlled by the carry pulse from the upstream stage and connected between a charging voltage line, the charging voltage line transferring a charging voltage, and the set node, a second switching device controlled by the carry pulse from the downstream stage and connected between the set node and a third discharging voltage line, the third discharging voltage line transferring a third discharging voltage, a third switching device controlled by the voltage at the reset node and connected between the set node and a fourth discharging voltage line, the fourth discharging voltage line transferring a fourth discharging voltage, and an inverter for controlling the voltage at the reset node in response to the voltage at the set node.

The inverter of each of the stages may include a first inverting switching device controlled by a high voltage from a high voltage line and connected between the high voltage line and the reset node, a second inverting switching device controlled by the voltage at the set node and connected between the reset node and a low voltage line, the low voltage line transferring a low voltage, and a third inverting switching device controlled by the carry pulse from the upstream stage and connected between the reset node and the low voltage line.

Alternatively, the inverter of each of the stages may include a first inverting switching device controlled by an external control signal and connected between a high voltage line, the high voltage line transferring a high voltage, and the reset node, a second inverting switching device controlled by the voltage at the set node and connected between the reset node and a low voltage line, the low voltage line transferring a low voltage, and a third inverting switching device controlled by the carry pulse from the upstream stage and connected between the reset node and the low voltage line.

As another alternative, the inverter of each of the stages may include a first inverting switching device controlled by a high voltage from a high voltage line and connected between the high voltage line and a common node, a second inverting switching device controlled by the voltage at the set node and connected between the common node and a low voltage line, the low voltage line transferring a low voltage, a third inverting switching device controlled by a voltage at the common node and connected between the high voltage line and the reset node, a fourth inverting switching device controlled by the voltage at the set node and connected between the reset node and the low voltage line, and a fifth inverting switching device controlled by the carry pulse from the upstream stage and connected between the reset node and the low voltage line.

In another aspect of the present invention, each of the stages may further include a first set node, a second set node, a reset node, a scan output terminal, a carry output terminal, a first control switching device, a second control switching device, and a node controller for controlling voltages at the first set node and reset node in response to a carry pulse from the upstream stage and a carry pulse from the downstream stage, wherein the carry output unit of each of the stages may include a carry pull-up switching device controlled by a voltage at the second set node and connected between a carry clock transfer line, the carry clock transfer line transferring any one of the carry clock pulses, and the carry output terminal, wherein the scan output unit of each of the stages may include a scan pull-up switching device controlled by the voltage at the first set node and connected between a scan clock transfer line, the scan clock transfer line transferring any one of the scan clock pulses, and the scan output terminal, wherein the first control switching device may be controlled by the voltage at the first set node and be connected between the first set node and the second set node, and wherein the second control switching device may be controlled by a specific signal and be connected between the second set node and a specific node, wherein the specific signal may be the voltage at the reset node or any one of the carry clock pulses, and wherein the specific node may be a fifth discharging voltage line, the fifth discharging voltage line transferring a fifth discharging voltage, or the first set node.

The scan pull-up switching device may have a channel width larger than that of the carry pull-up switching device.

The carry output unit of each of the stages may further include a carry pull-down switching device controlled by the voltage at the reset node or any one of the carry clock pulses and connected between the carry output terminal and a second discharging voltage line, the second discharging voltage line transferring a second discharging voltage, and the scan output unit of each of the stages may further include a scan pull-down switching device controlled by the voltage at the reset node and connected between the scan output terminal and a first discharging voltage line, the first discharging voltage line transferring a first discharging voltage, wherein, assuming that a channel width of the carry pull-up switching device is W1, a channel width of the carry pull-down switching device is W2, a channel width of the scan pull-up switching device is W3 and a channel width of the scan pull-down switching device is W4, W1 to W4 may be set to such values as to satisfy an equation of $(W4/W3)<(W2/W1)$.

In a further aspect of the present invention, each of the stages may further include a set node, a first reset node, a second reset node, a scan output terminal, a carry output terminal, and a node controller for controlling voltages at the set node, first reset node and second reset node in response to a carry pulse from the upstream stage and a carry pulse from the downstream stage, wherein the carry output unit of each of the stages may include a carry pull-up switching device, and wherein the scan output unit of each of the stages may include a scan pull-up switching device, a first scan pull-down switching device, and a second scan pull-down switching device, wherein the carry pull-up switching device may be controlled by the voltage at the set node and be connected between a carry clock transfer line, the carry clock transfer line transferring any one of the carry clock pulses, and the carry output terminal, wherein the scan pull-up switching device may be controlled by the voltage at the set node and be connected between a scan clock transfer line, the scan clock transfer line transferring any one of the scan clock pulses, and the scan output terminal, wherein the first scan pull-down switching device may be controlled by the voltage at the first reset node and be connected between the scan output terminal and a first discharging voltage line, the first discharging voltage line transferring a first discharging voltage, and wherein the second scan pull-down switching device may be controlled by the voltage at the second reset node and be connected between the scan output terminal and a second discharging voltage line, the second discharging voltage line transferring a second discharging voltage.

The node controller of each of the stages may include a first switching device controlled by the carry pulse from the upstream stage and connected between a charging voltage line, the charging voltage line transferring a charging voltage, and the set node, a second switching device controlled by the carry pulse from the downstream stage and connected between the set node and a third discharging voltage line, the third discharging voltage line transferring a third discharging voltage, a third switching device controlled by the voltage at the first reset node and connected between the set node and a fourth discharging voltage line, the fourth discharging voltage line transferring a fourth discharging voltage, a fourth switching device controlled by the voltage at the second reset node and connected between the set node and a fifth discharging voltage line, the fifth discharging voltage line transferring a fifth discharging voltage, a first inverter for controlling the voltage at the first reset node in response to the voltage at the set node, and a second inverter for controlling the voltage at the second reset node in response to the voltage at the set node.

When the voltage at the set node is logic high, the first inverter may apply a low voltage to the first reset node and the second inverter may apply the low voltage to the second reset node, and when the voltage at the set node is logic low, the first inverter may apply a first alternating current (AC) voltage to the first reset node and the second inverter may apply a second AC voltage to the second reset node, wherein each of the first AC voltage and second AC voltage may be an AC signal which alternately has a high voltage and a low voltage at intervals of a frames (where a is a natural number), wherein the first AC voltage may be 180° phase-inverted with respect to the second AC voltage.

The carry output unit of each of the stages may further include a first carry pull-down switching device controlled by the voltage at the first reset node and connected between the carry output terminal and a sixth discharging voltage line, the sixth discharging voltage line transferring a sixth discharging voltage, and a second carry pull-down switching device controlled by the voltage at the second reset node and connected between the carry output terminal and a seventh discharging voltage line, the seventh discharging voltage line transferring a seventh discharging voltage.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
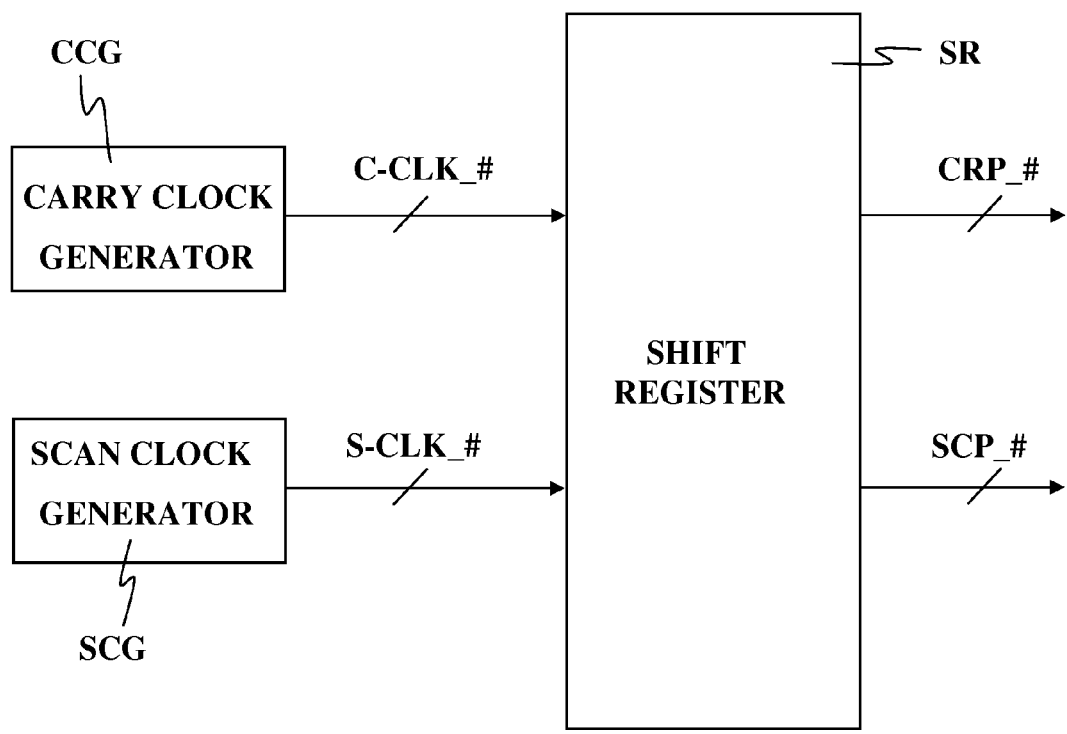
FIG. 1 is a block diagram showing the configuration of a gate driving circuit according to an embodiment of the present invention.
Figure 2:
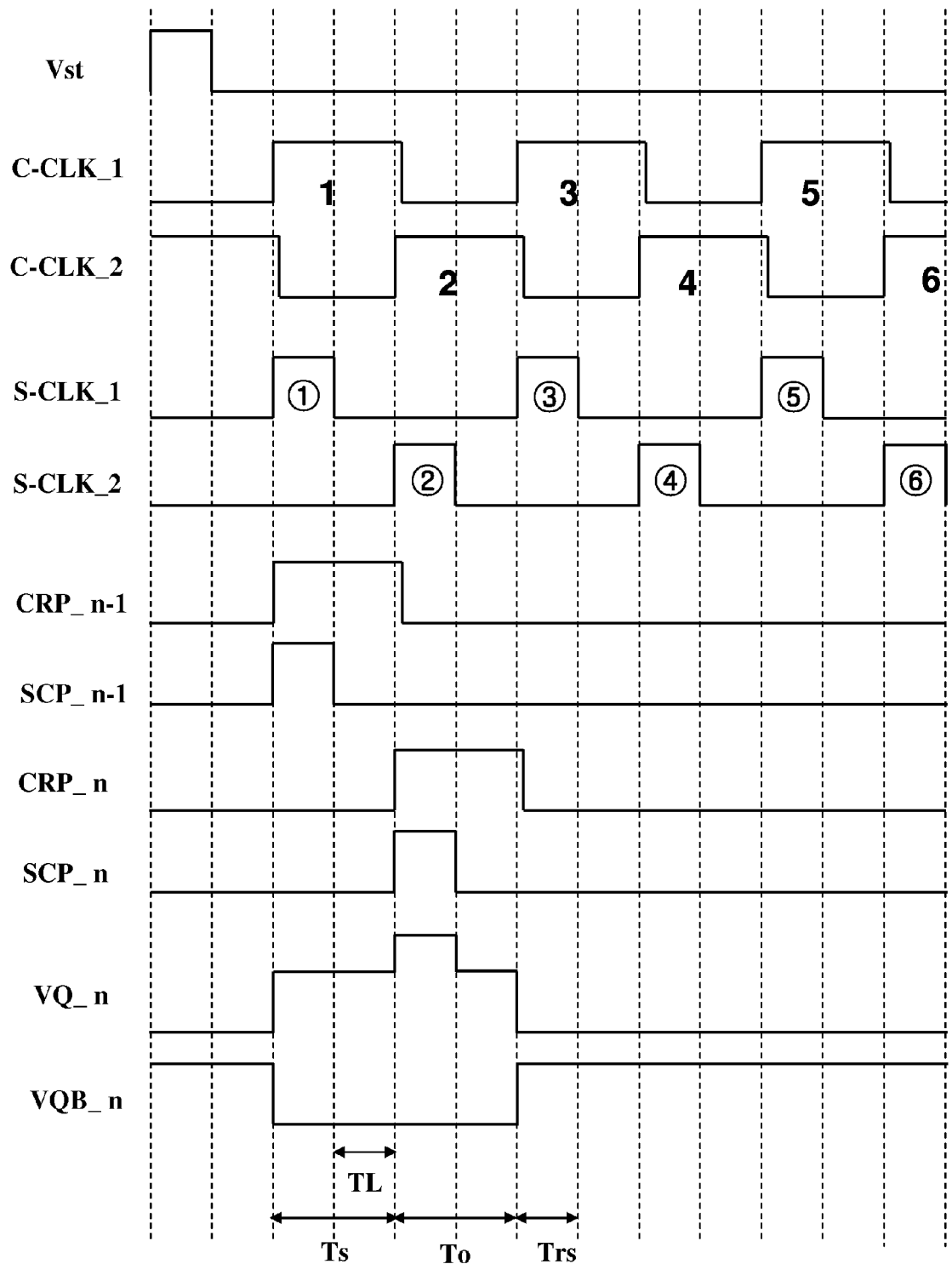
FIG. 2 is an output timing diagram illustrating various signals including carry clock pulses and scan clock pulses of one example output from a carry clock generator and a scan clock generator in FIG. 1.

FIG. 1 is a block diagram showing the configuration of a gate driving circuit according to an embodiment of the present invention, and FIG. 2 is an output timing diagram illustrating various signals including carry clock pulses and scan clock pulses of one example output from a carry clock generator and a scan clock generator in FIG. 1.

The gate driving circuit according to the present embodiment includes a carry clock generator CCG, a scan clock generator SCG, and a shift register SR, as shown in FIG. 1.

The carry clock generator CCG sequentially outputs carry clock pulses C-CLK_# (where i is a natural number which is 2 or larger). That is, this carry clock generator CCG outputs carry clock pulses of i phases. Each of the i carry clock pulses C-CLK_# consists of a plurality of carry impulses which are periodically output. For example, FIG. 2 shows carry clock pulses C-CLK_1 and C-CLK_2 of two phases, in which the first carry clock pulse C-CLK_1 is ahead in phase of the second carry clock pulse C-CLK_2. The first carry clock pulse C-CLK_1 includes a plurality of carry impulses 1, 3, 5, . . . which are periodically output, and the second carry clock pulse C-CLK_2 likewise includes a plurality of carry impulses 2, 4, 6, . . . which are periodically output. The carry clock generator CCG may output carry clock pulses of three or more phases.

The scan clock generator SCG sequentially outputs j scan clock pulses S-CLK_# (where j is a natural number which is 2 or larger). That is, this scan clock generator SCG outputs scan clock pulses of j phases. Each of the j scan clock pulses S-CLK_# consists of a plurality of scan impulses which are periodically output. For example, FIG. 2 shows scan clock pulses S-CLK_1 and S-CLK_2 of two phases, in which the first scan clock pulse S-CLK_1 is ahead in phase of the second scan clock pulse S-CLK_2. The first scan clock pulse S-CLK_1 includes a plurality of scan impulses ①, ③, ⑤, . . . which are periodically output, and the second scan clock pulse S-CLK_2 likewise includes a plurality of scan impulses ②, ④, ⑥, . . . which are periodically output. The scan clock generator SCG may output scan clock pulses of three or more phases.

In particular, a carry impulse (for example, 1) has a duration set to be longer than that of a scan impulse (for example, ①), as shown in FIG. 2.

The shift register SR includes a plurality of stages for receiving the i carry clock pulses C-CLK_# from the carry clock generator CCG and the j scan clock pulses S-CLK_# from the scan clock generator SCG and sequentially generating a plurality of outputs.

An output generated from each stage consists of a pair of carry pulse and scan pulse corresponding to each other. In the pair of carry pulse and scan pulse, the carry pulse is supplied to a downstream stage and an upstream stage, whereas the scan pulse is supplied to a corresponding gate line. Particularly, in the pair of carry pulse and scan pulse, the carry pulse and the scan pulse have different durations. In detail, the duration of the carry pulse is longer than the duration of the scan pulse.

In order to generate the above output, each stage includes a carry output unit and a scan output unit.

The carry output unit outputs the carry pulse to drive at least one of the downstream stage and upstream stage.

The scan output unit outputs the scan pulse to drive the corresponding gate line.

Each stage receives at least one of the i carry clock pulses which are out of phase with one another, and at least one of the j scan clock pulses which are out of phase with one another.

The carry output unit of each stage generates and outputs the carry pulse based on the at least one carry clock pulse.

The scan output unit of each stage generates and outputs the scan pulse based on the at least one scan clock pulse.

The scan impulses included in each of the j scan clock pulses are synchronized with carry impulses included in at least one carry clock pulse, respectively. In detail, each scan impulse in a scan clock pulse output in the kth order (where k is any one of natural numbers from 1 to j), among the j scan clock pulses, is synchronized with a carry impulse output in the (jm+k)th order (where m is a natural number including 0), among the carry impulses in the i carry clock pulses. A more detailed description will hereinafter be given with reference to an example.

That is, assuming that i and j are both set to 2 as shown in FIG. 2, the above expression 'jm+k' is defined as '2m+k', where k is any one of natural numbers from 1 to 2. In this case, the scan clock pulse S-CLK__1 output in the first order (i.e., k=1), of the two (two-phase) scan clock pulses, is synchronized with a carry impulse output in the '(2m+1)th' order. In other words, the scan clock pulse S-CLK__1 output in the first order includes the scan impulses ①, ③, ⑤, . . . which are synchronized with the carry impulses 1, 3, 5, . . . sequentially output in the odd order, respectively.

In the same manner, the scan clock pulse S-CLK__2 output in the second order (i.e., k=2), of the two scan clock pulses, is synchronized with a carry impulse output in the '(2m+2)th' order. In other words, the scan clock pulse S-CLK__2 output in the second order includes the scan impulses ②, ④, ⑥, . . . which are synchronized with the carry impulses 2, 4, 6, . . . sequentially output in the even order, respectively.

Accordingly, when i and j are both 2 (i.e., when the carry clock pulses and the scan clock pulses are both of two phases), the scan impulses included in the first scan clock pulse S-CLK__1 are output synchronously with the carry impulses included in the first carry clock pulse C-CLK__1, respectively, and the scan impulses included in the second scan clock pulse S-CLK__2 are output synchronously with the carry impulses included in the second carry clock pulse C-CLK__2, respectively.

As an example, each of the scan impulses in the first scan clock pulse S-CLK__1 and a corresponding one of the carry impulses in the first carry clock pulse C-CLK__1 may make low to high voltage transitions at the same time, as shown in FIG. 2. In other words, a scan impulse and a carry impulse corresponding to each other may have rising edges which coincide with each other. Here, the carry impulse may have a falling edge which is behind that of the scan impulse, as shown in FIG. 2.

As another example, in a carry impulse and a scan impulse synchronized with each other, the rising edge of the carry impulse may be ahead of or behind that of the scan impulse.

In this case, the scan impulse and the carry impulse corresponding to each other may have different durations irrespective of variations in the above rising time and falling time. That is, the duration of the carry impulse may be longer than that of the scan impulse. For example, the carry impulse (for example, 1 in FIG. 2) may have a pulse width set to be larger than that of the scan impulse (for example, ① in FIG. 2).

On the other hand, the carry impulse and the scan impulse may have the same or different high voltages. Also, the carry impulse and the scan impulse may have the same or different low voltages.

Figure 3:
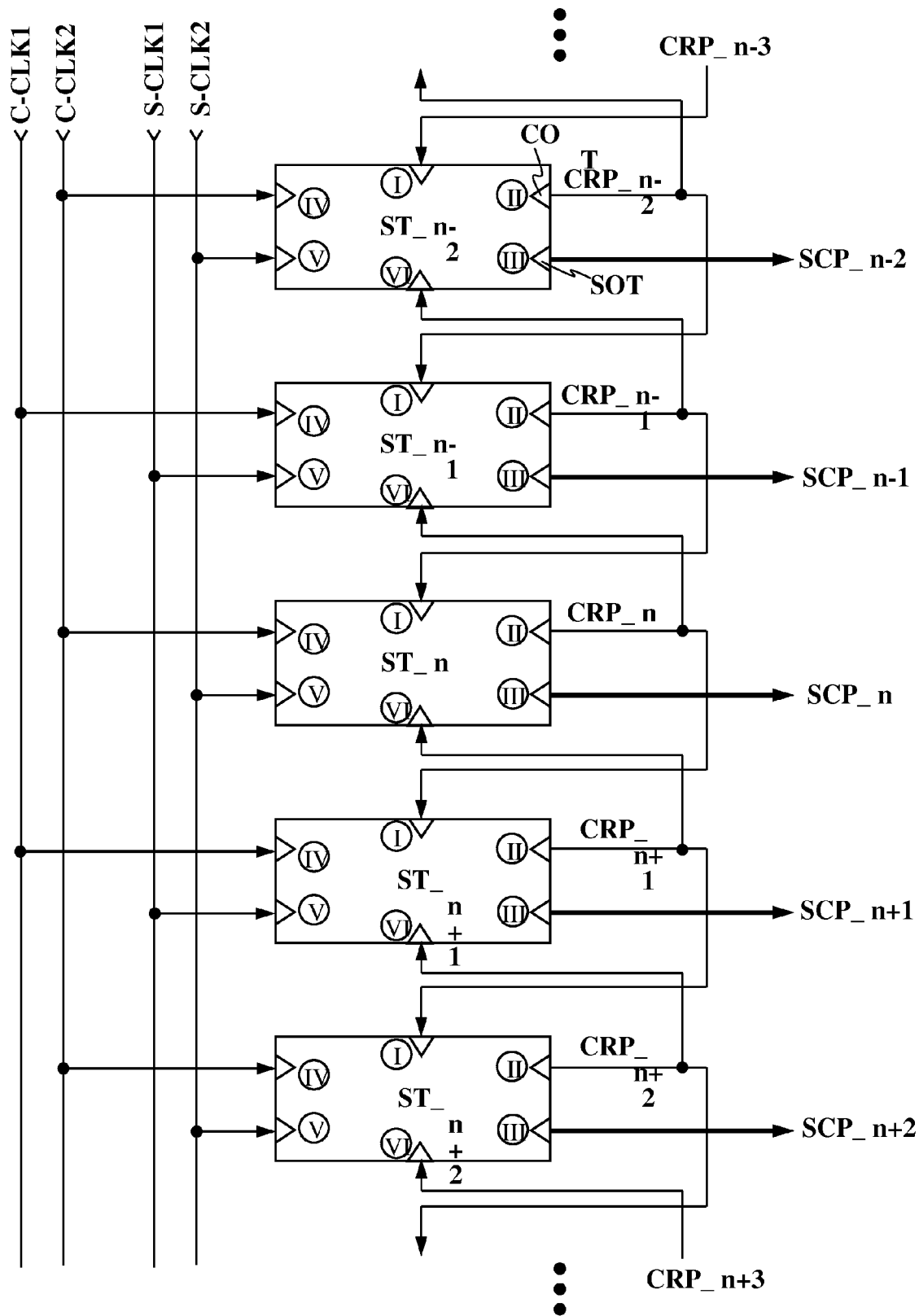
FIG. 3 is a detailed block diagram of a shift register in FIG. 1.

FIG. 3 is a detailed block diagram of the shift register SR in FIG. 1.

The shift register SR according to the present invention includes a plurality of stages ST_n−2 to ST_n+2, as shown in FIG. 3. Here, each stage outputs a carry pulse CRPn−2 to CRPn+2 through a number 2 terminal II (referred to hereinafter as a carry output terminal COT) thereof. Also, each stage outputs a scan pulse SCPn−2 to SCPn+2 through a number 3 terminal III (referred to hereinafter as a scan output terminal SOT) thereof.

Each stage includes, as shown in FIG. 3, a total of six terminals I, II, III, IV, V and VI, in which the number 1 terminal I is supplied with an output from an upstream stage (or a start pulse Vst), the number 4 terminal IV is supplied with any one carry clock pulse, the number 5 terminal V is supplied with any one scan clock pulse, and the number 6 terminal is supplied with an output from a downstream stage (or the start pulse Vst). On the other hand, the carry pulse and the scan pulse as stated above are independently output through the number 2 terminal II and the number 3 terminal III, respectively.

For example, assuming that n in FIG. 3 is set to an even natural number, the paired first carry clock pulse C-CLK__1 and first scan clock pulse S-CLK__1 may be input respectively to the number 4 terminal IV and number 5 terminal V of an odd stage (for example, ST_n−1 or ST_n+1 in FIG. 3). In contrast, the paired second carry clock pulse C-CLK__2 and second scan clock pulse S-CLK__2 may be input respectively to the number 4 terminal IV and number 5 terminal V of an even stage (for example, ST_n−2, ST_n or ST_n+2 in FIG. 3). Also, the converse may be possible.

Each stage controls the operations of a stage downstream therefrom and a stage upstream therefrom using a carry pulse. Also, each stage drives a gate line connected thereto using a scan pulse. On the other hand, although not shown, a dummy stage may further be provided downstream of the last stage to supply a carry pulse to the last stage. According to a given configuration of the shift register SR, the dummy stage may be plural in number, not one in number. Because the dummy stage is not connected to any gate line, it does not output a scan pulse.

On the other hand, according to a given configuration of the shift register SR, each stage may control the operation of only an upstream stage using a carry pulse. On the other hand, although not shown, a dummy stage may further be provided downstream of the last stage to supply a scan pulse to the last stage. According to a given configuration of the shift register SR, the dummy stage may be plural in number, not one in number.

The first to last stages generate outputs thereof in order from the first stage to the last stage. Each output consists of a carry pulse and a scan pulse, as stated above.

The scan pulses output from the stages other than the dummy stages are sequentially supplied to gate lines of a display panel (not shown) to sequentially scan the gate lines. Also, the carry pulse output from each of the stages is supplied to an upstream stage and a downstream stage.

This shift register SR may be built in the display panel. That is, the display panel has a display region for displaying an image, and a non-display region surrounding the display region, and the shift register SR is built in the non-display region.

Figure 4:
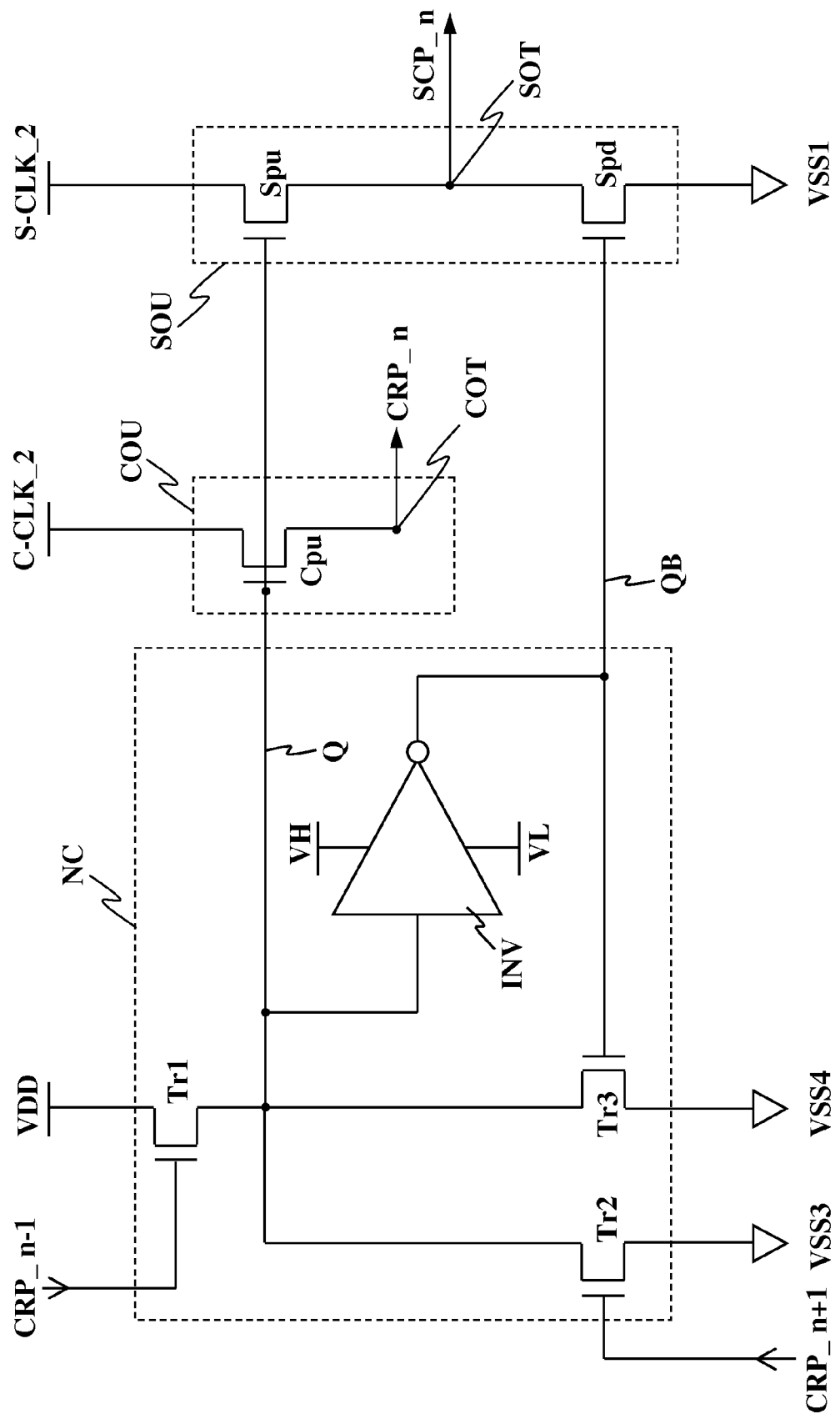
FIG. 4 is a circuit diagram of a first embodiment of an arbitrary stage in FIG. 3.

FIG. 4 is a circuit diagram of a first embodiment of an arbitrary stage in FIG. 3.

The arbitrary stage, for example, the nth stage ST_n includes a set node Q, a reset node QB, a carry output terminal COT, a scan output terminal SOT, a node controller NC, a carry output unit COU, and a scan output unit SOU, as shown in FIG. 4.

The node controller NC of the nth stage ST_n controls voltages at the set node Q and reset node QB in response to a carry pulse CRP_n−1 from an upstream stage and a carry pulse CRP_n+1 from a downstream stage. To this end, the node controller NC of the nth stage ST_n includes first to third switching devices Tr1 to Tr3 and an inverter INV, as shown in FIG. 4.

The carry output unit COU of the nth stage ST_n includes a carry pull-up switching device Cpu, as shown in FIG. 4.

The scan output unit SOU of the nth stage ST_n includes a scan pull-up switching device Spu and a scan pull-down switching device Spd, as shown in FIG. 4.

Hereinafter, a detailed description will be given of the functions of the first switching device Tr1, second switching device Tr2, third switching device Tr3, carry pull-up switching device Cpu, scan pull-up switching device Spu, scan pull-down switching device Spd and inverter INV provided in the nth stage ST_n.

The first switching device Tr1 of the nth stage ST_n is controlled by the carry pulse CRP_n−1 from the upstream stage (for example, the (n−1)th stage ST_n−1) and is connected between a charging voltage line and the set node Q. That is, the first switching device Tr1 is turned on or off in response to the carry pulse CRP_n−1 from the upstream stage ST_n−1, and interconnects the charging voltage line and the set node Q when turned on. The charging voltage line transfers a charging voltage VDD.

The second switching device Tr2 of the nth stage ST_n is controlled by the carry pulse CRP_n+1 from the downstream stage (for example, the (n+1)th stage ST_n+1) and is connected between the set node Q and a third discharging voltage line. That is, the second switching device Tr2 is turned on or off in response to the carry pulse CRP_n+1 from the downstream stage ST_n+1, and interconnects the set node Q and the third discharging voltage line when turned on. The third discharging voltage line transfers a third discharging voltage VSS3.

The third switching device Tr3 of the nth stage ST_n is controlled by the voltage at the reset node QB and is connected between the set node Q and a fourth discharging voltage line. That is, the third switching device Tr3 is turned on or off in response to the voltage at the reset node QB, and interconnects the set node Q and the fourth discharging voltage line when turned on. The fourth discharging voltage line transfers a fourth discharging voltage VSS4.

The inverter INV of the nth stage ST_n controls the voltage at the reset node QB in response to the voltage at the set node Q. For example, when the voltage at the set node Q is logic high, the inverter INV may make the voltage at the reset node QB logic low in response thereto. In contrast, when the voltage at the set node Q is logic low, the inverter INV may make the voltage at the reset node QB logic high in response thereto. The configuration of this inverter INV will be described later in more detail.

The carry pull-up switching device Cpu of the nth stage ST_n is controlled by the voltage at the set node Q and is connected between any one carry clock transfer line and the carry output terminal COT of the nth stage ST_n. That is, the carry pull-up switching device Cpu is turned on or off in response to the voltage at the set node Q, and interconnects the carry clock transfer line and the carry output terminal COT when turned on. Here, the nth stage ST_n has i carry clock transfer lines, which transfer i carry clock pulses, respectively.

The scan pull-up switching device Spu of the nth stage ST_n is controlled by the voltage at the set node Q and is connected between any one scan clock transfer line and the scan output terminal SOT of the nth stage ST_n. That is, the scan pull-up switching device Spu is turned on or off in response to the voltage at the set node Q, and interconnects the scan clock transfer line and the scan output terminal SOT when turned on. Here, the nth stage ST_n has j scan clock transfer lines, which transfer j scan clock pulses, respectively.

The scan pull-down switching device Spd of the nth stage ST_n is controlled by the voltage at the reset node QB and is connected between the scan output terminal SOT of the nth stage ST_n and a first discharging voltage line. That is, the scan pull-down switching device Spd is turned on or off in response to the voltage at the reset node QB, and interconnects the scan output terminal SOT of the nth stage ST_n and the first discharging voltage line when turned on. Here, the first discharging voltage line transfers a first discharging voltage VSS1.

Figure 5A:
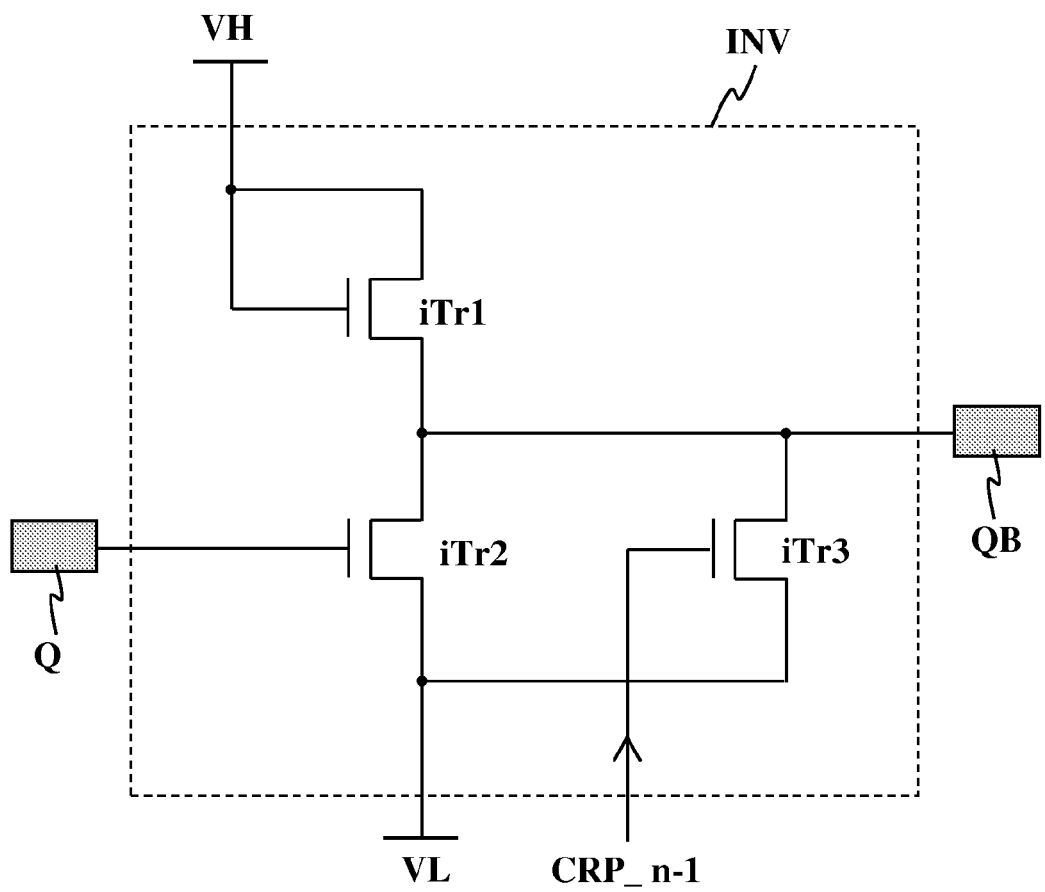
FIG. 5A is a circuit diagram of a first embodiment of an inverter in FIG. 4.

FIG. 5A is a circuit diagram of a first embodiment of the inverter INV in FIG. 4.

The inverter INV of the arbitrary stage, for example, the nth stage ST_n may include first to third inverting switching devices iTr1 to iTr3, as shown in FIG. 5A.

The first inverting switching device iTr1 of the nth stage ST_n is controlled by a high voltage VH from a high voltage line and is connected between the high voltage line and the reset node QB. That is, the first inverting switching device iTr1 is turned on or off in response to the high voltage VH, and interconnects the high voltage line and the reset node QB when turned on.

The second inverting switching device iTr2 of the nth stage ST_n is controlled by the voltage at the set node Q and is connected between the reset node QB and a low voltage line. That is, the second inverting switching device iTr2 is turned on or off in response to the voltage at the set node Q, and interconnects the reset node QB and the low voltage line when turned on. The low voltage line transfers a low voltage VL.

The third inverting switching device iTr3 of the nth stage ST_n is controlled by the carry pulse CRP_n−1 from the upstream stage (for example, the (n−1)th stage ST_n−1) and is connected between the reset node QB and the low voltage line. That is, the third inverting switching device iTr3 is turned on or off in response to the carry pulse CRP_n−1 from the upstream stage, and interconnects the reset node QB and the low voltage line when turned on.

Figure 5B:
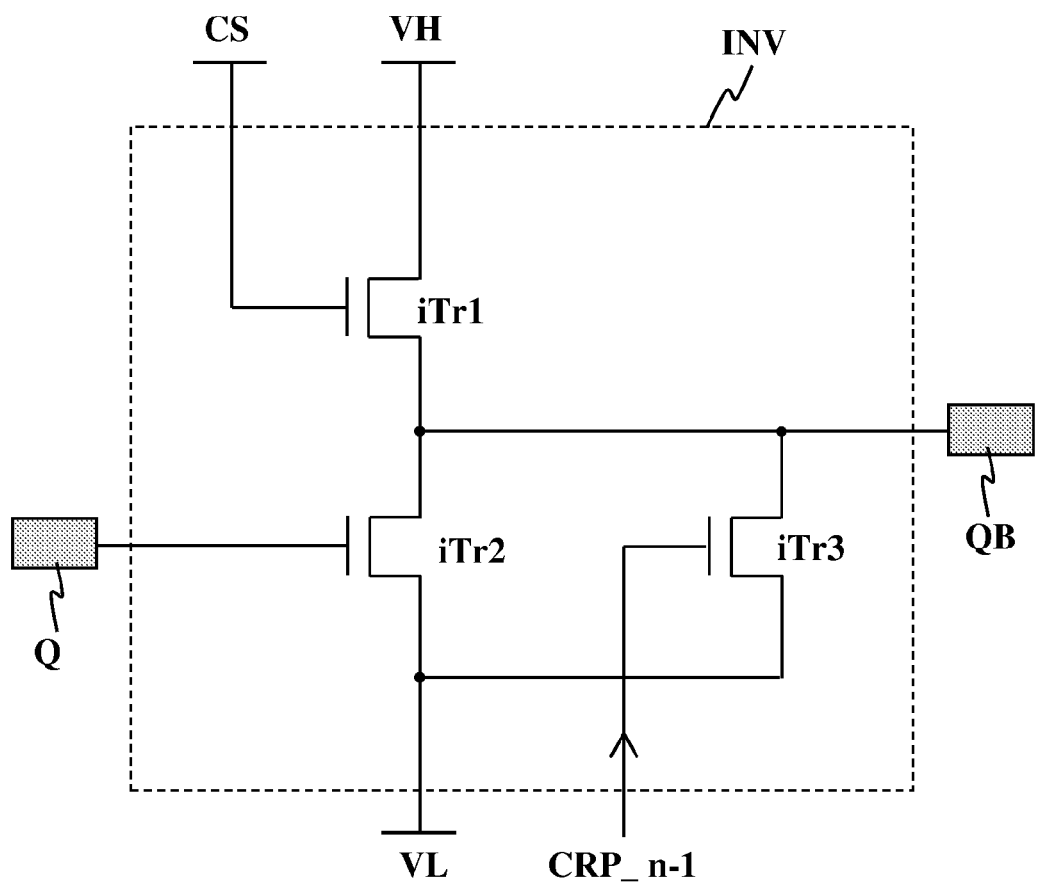
FIG. 5B is a circuit diagram of a second embodiment of the inverter in FIG. 4.

FIG. 5B is a circuit diagram of a second embodiment of the inverter INV in FIG. 4.

The inverter INV of the arbitrary stage, for example, the nth stage ST_n may include first to third inverting switching devices iTr1 to iTr3, as shown in FIG. 5B.

The first inverting switching device iTr1 of the nth stage ST_n is controlled by an external control signal CS and is connected between a high voltage line and the reset node QB. That is, the first inverting switching device iTr1 is turned on or off in response to the control signal CS, and interconnects the high voltage line and the reset node QB when turned on.

The second and third inverting switching devices iTr2 and iTr3 of the nth stage ST_n are the same in configuration as the above-stated second and third inverting switching devices iTr2 and iTr3 in FIG. 5A, respectively, and a functional description thereof will thus be replaced by the above description given with reference to FIG. 5A.

Figure 5C:
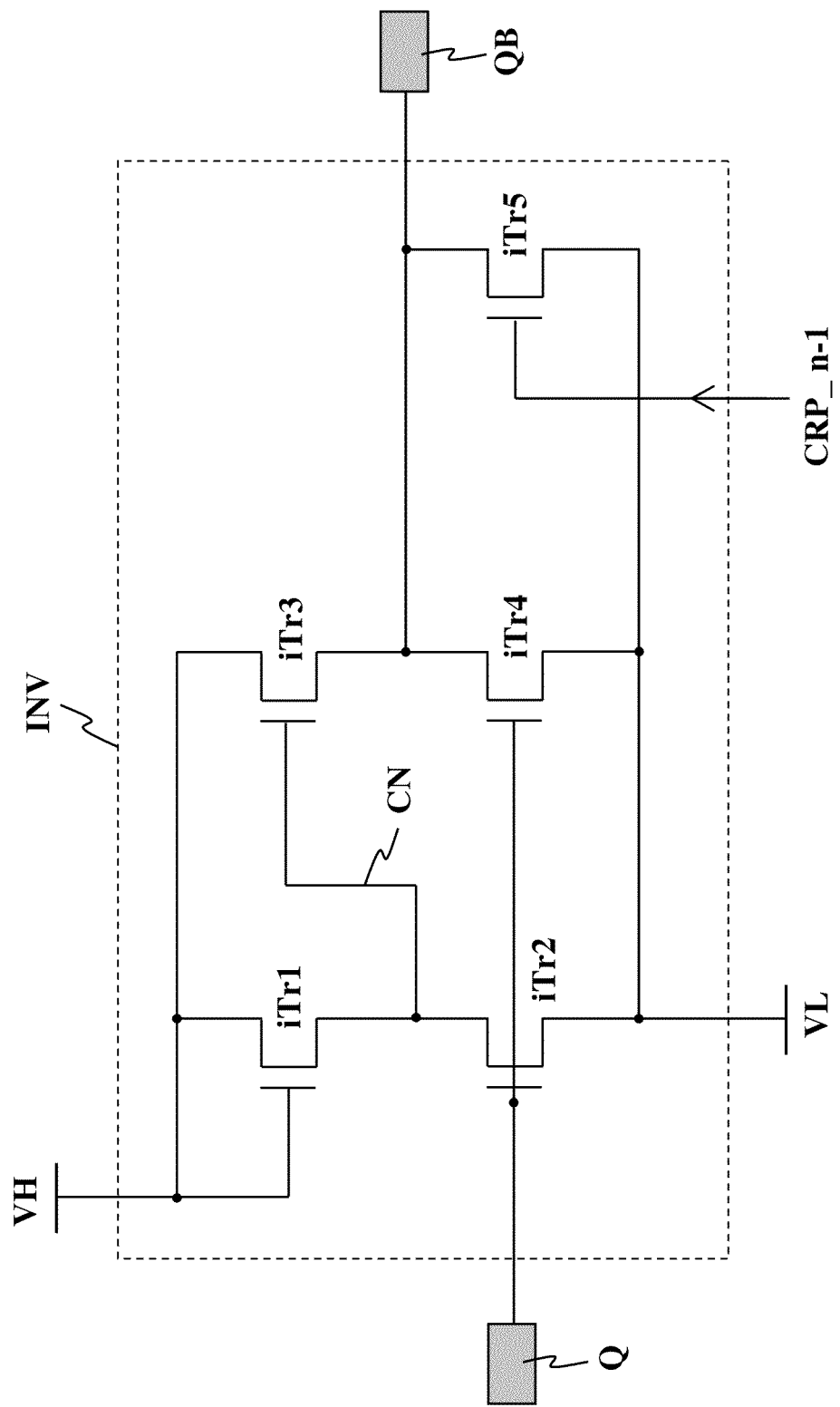
FIG. 5C is a circuit diagram of a third embodiment of the inverter in FIG. 4.

FIG. 5C is a circuit diagram of a third embodiment of the inverter INV in FIG. 4.

The inverter INV of the arbitrary stage, for example, the nth stage ST_n may include first to fifth inverting switching devices iTr1 to iTr5, as shown in FIG. 5C.

The first inverting switching device iTr1 of the nth stage ST_n is controlled by a high voltage VH from a high voltage line and is connected between the high voltage line and a common node CN. That is, the first inverting switching device iTr1 is turned on or off in response to the high voltage VH, and interconnects the high voltage line and the common node CN when turned on.

The second inverting switching device iTr2 of the nth stage ST_n is controlled by the voltage at the set node Q and is connected between the common node CN and a low voltage line. That is, the second inverting switching device iTr2 is turned on or off in response to the voltage at the set node Q, and interconnects the common node CN and the low voltage line when turned on. The low voltage line transfers a low voltage VL.

The third inverting switching device iTr3 of the nth stage ST_n is controlled by a voltage at the common node CN and is connected between the high voltage line and the reset node QB. That is, the third inverting switching device iTr3 is turned on or off in response to the voltage at the common node CN, and interconnects the high voltage line and the reset node QB when turned on.

The fourth inverting switching device iTr4 of the nth stage ST_n is controlled by the voltage at the set node Q and is connected between the reset node QB and the low voltage line. That is, the fourth inverting switching device iTr4 is turned on or off in response to the voltage at the set node Q, and interconnects the reset node QB and the low voltage line when turned on.

The fifth inverting switching device iTr5 of the nth stage ST_n is controlled by the carry pulse CRP_n−1 from the upstream stage (for example, the (n−1)th stage ST_n−1) and is connected between the reset node QB and the low voltage line. That is, the fifth inverting switching device iTr5 is turned on or off in response to the carry pulse CRP_n−1 from the upstream stage, and interconnects the reset node QB and the low voltage line when turned on.

Hereinafter, the operation of the nth stage ST_n with the above-stated configuration will be described in detail with reference to FIGS. 2, 4 and 5A.

1) Set Period Ts

In a set period Ts of the nth stage ST_n, the carry pulse CRP_n−1, which is in its high voltage state, and the scan pulse SCP_n−1, which is in its high voltage state, are generated from the (n−1)th stage ST_n−1. Hereinafter, the carry pulse CRP_n−1 from the (n−1)th stage ST_n−1 will be referred to as an (n−1)th carry pulse CRP_n−1 and the scan pulse SCP_n−1 from the (n−1)th stage ST_n−1 will be referred to as an (n−1)th scan pulse SCP_n−1. The (n−1)th carry pulse CRP_n−1 is applied to the gate electrode of the first switching device Tr1 of the nth stage ST_n.

Accordingly, the first switching device Tr1 is turned on, and the charging voltage VDD is applied to the set node Q through the turned-on first switching device Tr1. As a result, the set node Q is charged, and the carry pull-up switching device Cpu and scan pull-up switching device Spu, connected to the charged set node Q through the gate electrodes thereof, are turned on.

On the other hand, when the set node Q is charged, the inverter INV discharges the reset node QB in response thereto. That is, the second inverting switching device iTr2 is turned on by the charging of the set node Q, and the low voltage VL is applied to the reset node QB through the turned-on second inverting switching device iTr2, so as to discharge the reset node QB. The second inverting switching device iTr2 is larger in size (channel width) than the first inverting switching device iTr1, which has a diode state in which it is always kept on. Therefore, when the first and second inverting switching devices iTr1 and iTr2 are both kept on, the reset node QB is kept discharged.

On the other hand, because the (n−1)th carry pulse CRP_n−1 is in its high voltage state in the set period Ts of the nth stage ST_n as stated above, the third inverting switching device iTr3, supplied with the (n−1)th carry pulse CRP_n−1 through the gate electrode thereof, is turned on. As the third inverting switching device iTr3 is turned on, the reset node QB is discharged.

As the reset node QB is discharged in this manner, the third switching device Tr1 and scan pull-down switching device Spd, connected to the reset node QB through the gate electrodes thereof, are turned off.

2) Output Period To

In an output period To of the nth stage ST_n, the second carry clock pulse C-CLK_2 (for example, 2) and the second scan clock pulse S-CLK_2 (for example, ②) are generated and supplied to the nth stage ST_n. As a result, the second carry clock pulse C-CLK_2 is output as an nth carry pulse CRP_n through the turned-on carry pull-up switching device Cpu, and the second scan clock pulse S-CLK_2 is output as an nth scan pulse SCP_n through the turned-on scan pull-up switching device Spu.

2) Reset Period Trs

In a reset period Trs of the nth stage ST_n, the first carry clock pulse C-CLK_1 (for example, 3) and the first scan clock pulse S-CLK_1 (for example, ③) are generated, and the (n+1)th carry pulse CRP_n+1 and the (n+1)th scan pulse SCP_n+1 are thus generated from the (n+1)th stage ST_n+1. The (n+1)th carry pulse CRP_n+1 is supplied to the gate electrode of the second switching device Tr2 of the nth stage ST_n. Accordingly, the second switching device Tr2 is turned on, so that the third discharging voltage VSS3 is supplied to the set node Q, thereby causing the set node Q to be discharged. As a result, the carry pull-up switching device Cpu and scan pull-up switching device Spu, connected to the discharged set node Q through the gate electrodes thereof, are turned off.

Also, when the set node Q is discharged, the inverter INV charges the reset node QB in response thereto. That is, the second inverting switching device iTr2 is turned off by the discharging of the set node Q, so that the high voltage VH via the first inverting switching device iTr1 is supplied to the reset node QB. As a result, the reset node QB is charged.

As the reset node QB is charged in this manner, the third switching device Tr3 and scan pull-down switching device Spd, connected to the reset node QB through the gate electrodes thereof, are turned on.

When the scan pull-down switching device Spd is turned on, the first discharging voltage VSS1 is supplied to the scan output terminal SOT of the nth stage ST_n through the turned-on scan pull-down switching device Spd.

As described above, according to the present invention, even though the duty ratio of a scan pulse is so small that a low duration TL is generated between the scan pulse and a scan pulse output in an adjacent period, it is possible to prevent the voltage, denoted by VQ_n, at the set node Q of the corresponding stage from falling in the set period Ts. The reason is that a carry pulse is generated using a carry clock pulse, which is kept high for a longer time than a scan clock pulse, and the first switching device Tr1 is turned on for a sufficient time including the low duration TL using the carry pulse. Therefore, as can be seen from FIG. 2, the voltage VQ_n at the set node Q of the nth stage ST_n does not fall, but is maintained as it is, during the low duration TL. On the other hand, VQB_n in FIG. 2 signifies the voltage at the reset node QB of the nth stage.

Moreover, in the present invention, the carry pull-up switching device Cpu to output the carry pulse and the scan pull-up switching device Spu to output the scan pulse are separately used, thereby making it possible to reduce the size (channel width) of the carry pull-up switching device Cpu, to which a relatively small load is applied.

Figure 6:
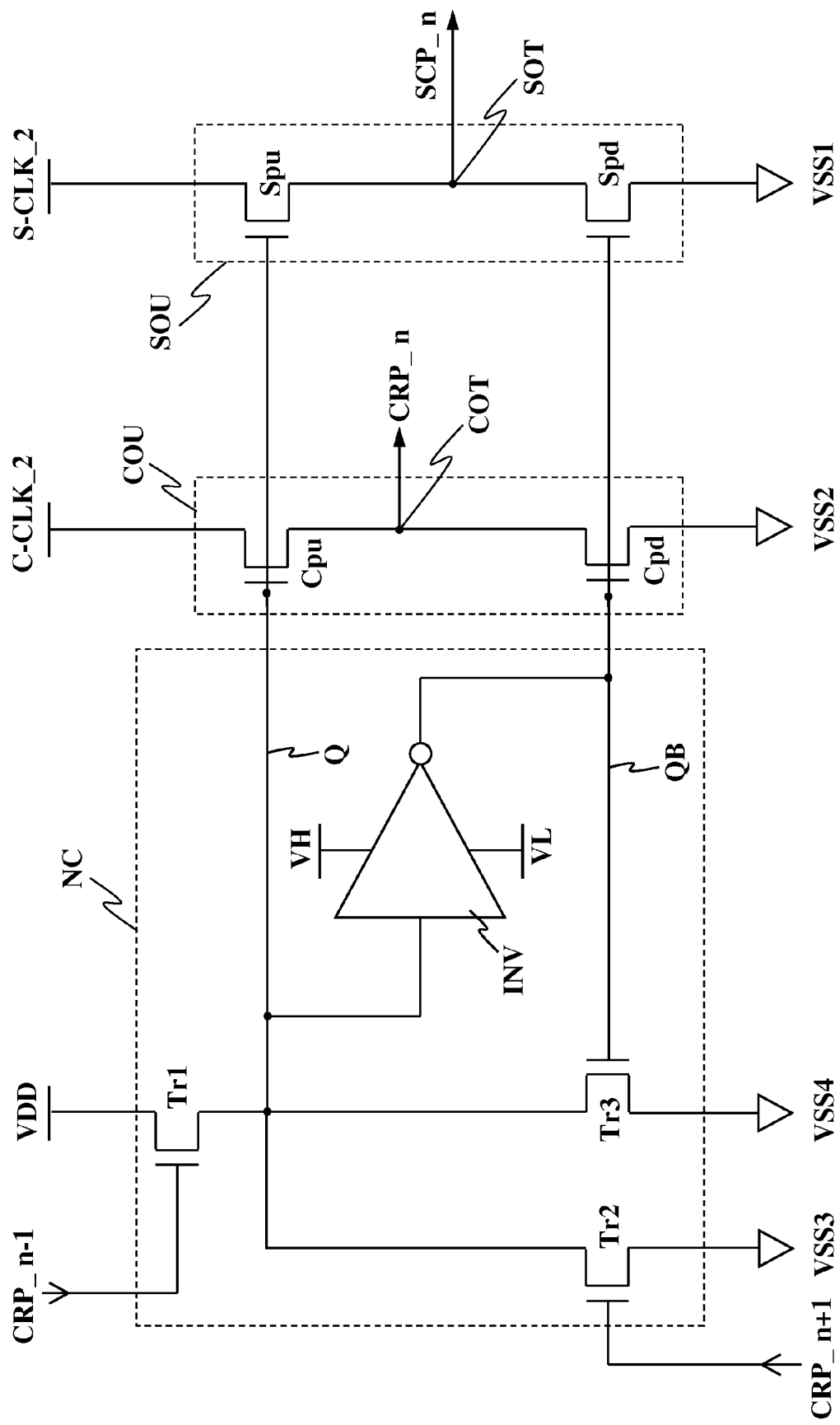
FIG. 6 is a circuit diagram of a second embodiment of the arbitrary stage in FIG. 3.

FIG. 6 is a circuit diagram of a second embodiment of the arbitrary stage in FIG. 3.

The arbitrary stage, for example, the nth stage ST_n includes a set node Q, a reset node QB, a carry output terminal COT, a scan output terminal SOT, a node controller NC, a carry output unit COU, and a scan output unit SOU, as shown in FIG. 6.

The node controller NC and scan output unit SOU in FIG. 6 are the same in configuration as those in FIG. 4, stated above, respectively, and a description thereof will thus be replaced by the above description given with reference to FIG. 4. Exceptionally, the carry output unit COU in FIG. 6 further includes a carry pull-down switching device Cpd, as compared with that in FIG. 4.

The carry pull-down switching device Cpd of the nth stage ST_n is controlled by the voltage at the reset node QB and is connected between the carry output terminal COT of the nth stage ST_n and a second discharging voltage line. That is, the carry pull-down switching device Cpd is turned on or off in response to the voltage at the reset node QB, and interconnects the carry output terminal COT of the nth stage ST_n and the second discharging voltage line when turned on. Here, the second discharging voltage line transfers a second discharging voltage VSS2.

On the other hand, the inverter INV in FIG. 6 may have any one of the above-stated configurations proposed in FIGS. 5A to 5C.

Figure 7:
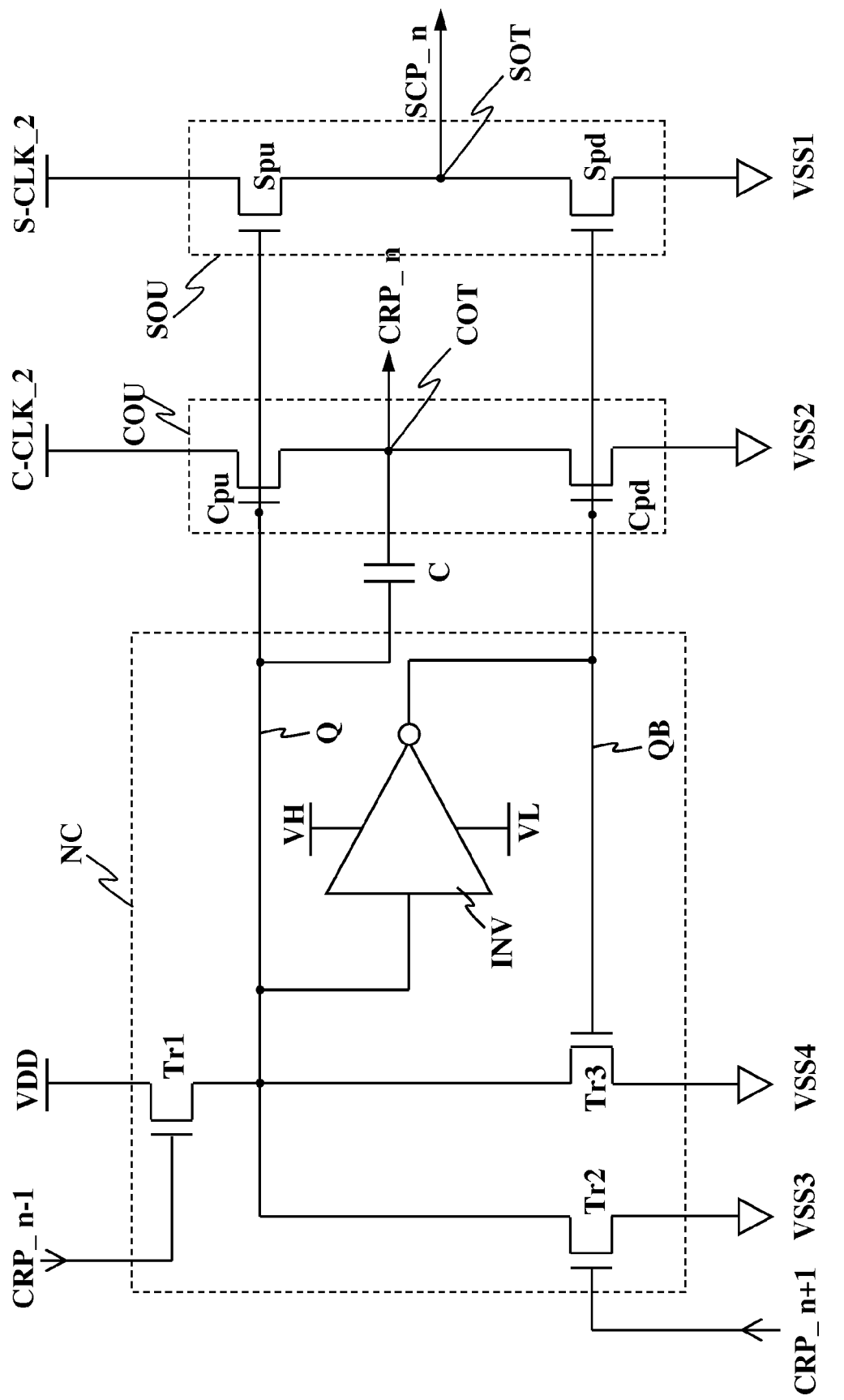
FIG. 7 is a circuit diagram of a third embodiment of the arbitrary stage in FIG. 3.

FIG. 7 is a circuit diagram of a third embodiment of the arbitrary stage in FIG. 3.

The arbitrary stage, for example, the nth stage ST_n includes a set node Q, a reset node QB, a carry output terminal COT, a scan output terminal SOT, a node controller NC, a carry output unit COU, and a scan output unit SOU, as shown in FIG. 7.

The node controller NC and scan output unit SOU in FIG. 7 are the same in configuration as those in FIG. 6, stated above, respectively, and a description thereof will thus be replaced by the above description given with reference to FIG. 6. Exceptionally, the stage of FIG. 7 further includes a capacitor C, as compared with that of FIG. 6.

The capacitor C of the nth stage ST_n is connected between the set node Q and the carry output terminal COT of the nth stage ST_n.

On the other hand, the inverter INV in FIG. 7 may have any one of the above-stated configurations proposed in FIGS. 5A to 5C.

Figure 8:
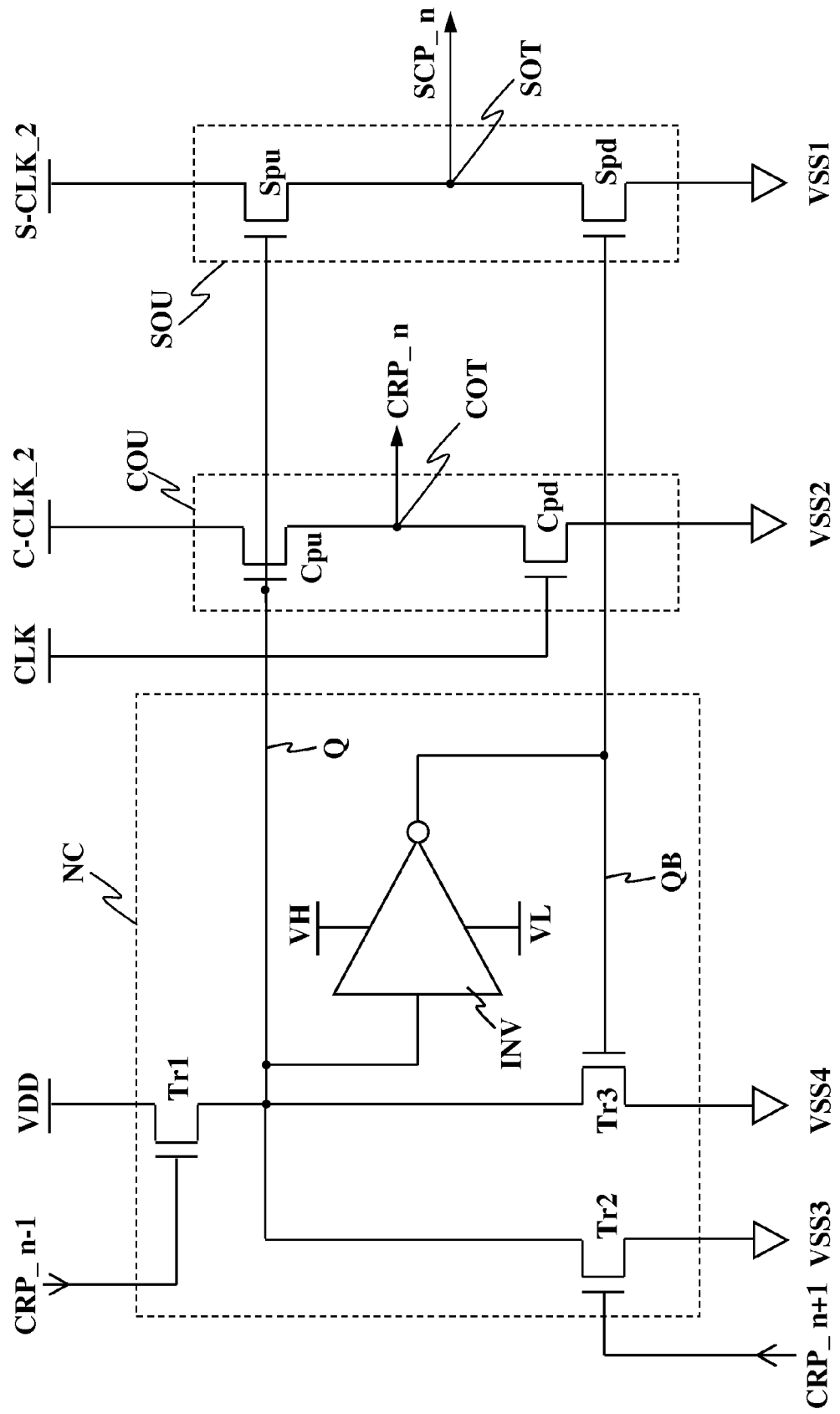
FIG. 8 is a circuit diagram of a fourth embodiment of the arbitrary stage in FIG. 3.

FIG. 8 is a circuit diagram of a fourth embodiment of the arbitrary stage in FIG. 3.

The arbitrary stage, for example, the nth stage ST_n includes a set node Q, a reset node QB, a carry output terminal COT, a scan output terminal SOT, a node controller NC, a carry output unit COU, and a scan output unit SOU, as shown in FIG. 8.

The node controller NC and scan output unit SOU in FIG. 8 are the same in configuration as those in FIG. 4, stated above, respectively, and a description thereof will thus be replaced by the above description given with reference to FIG. 4. Exceptionally, the carry output unit COU in FIG. 8 further includes a carry pull-down switching device Cpd, as compared with that in FIG. 4.

The carry pull-down switching device Cpd of the nth stage ST_n is controlled by any one carry clock pulse and is connected between the carry output terminal COT of the nth stage ST_n and a second discharging voltage line. That is, the carry pull-down switching device Cpd is turned on or off in response to the carry clock pulse, and interconnects the carry output terminal COT of the nth stage ST_n and the second discharging voltage line when turned on. Here, the second discharging voltage line transfers a second discharging voltage VSS2.

Here, the carry clock pulse applied to the carry pull-down switching device Cpd does not overlap with a carry clock pulse applied to the carry pull-up switching device Cpu of the same stage, which will be described later in more detail.

On the other hand, the inverter INV in FIG. 8 may have any one of the above-stated configurations proposed in FIGS. 5A to 5C.

Figure 9:
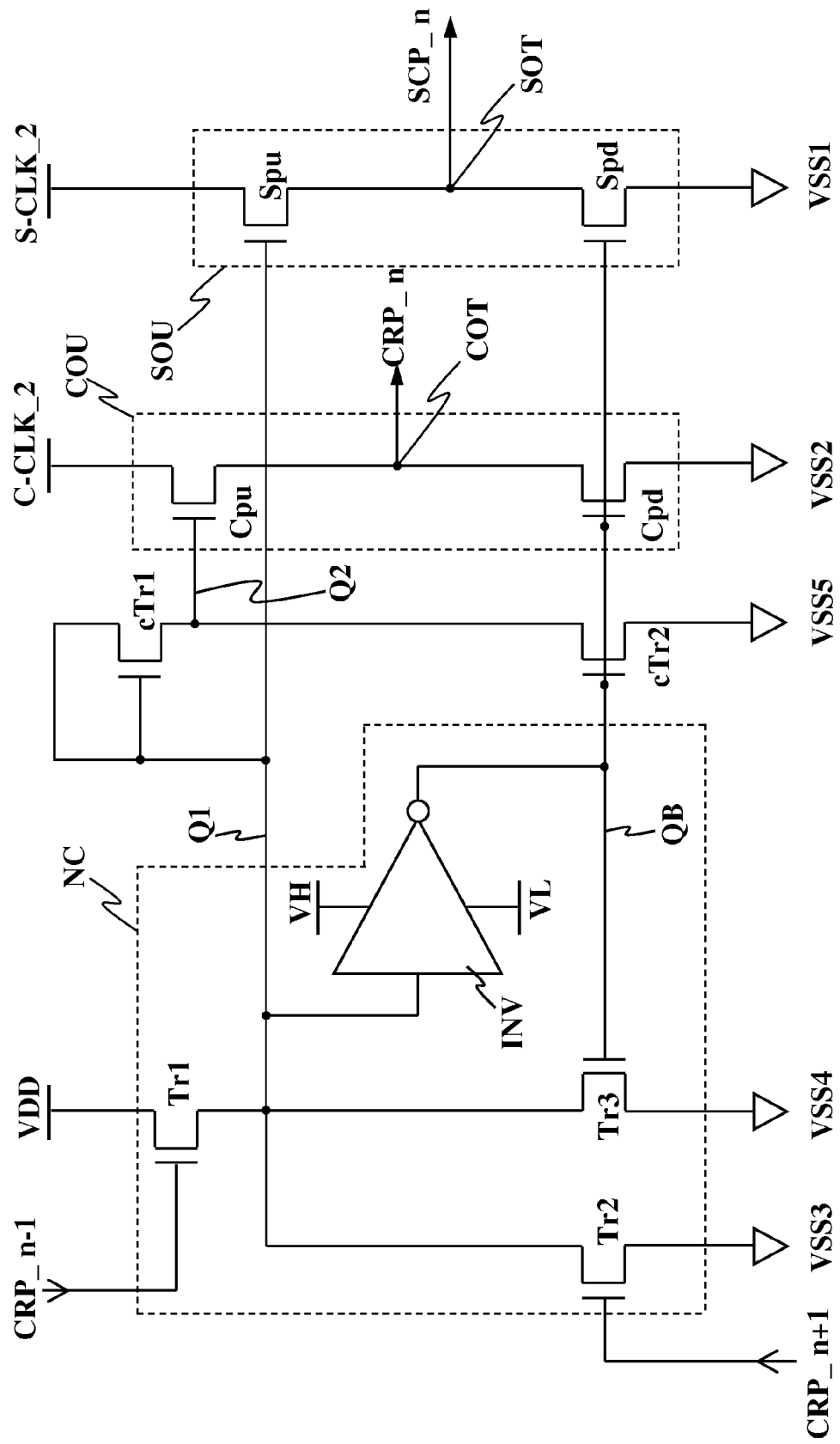
FIG. 9 is a circuit diagram of a fifth embodiment of the arbitrary stage in FIG. 3.

FIG. 9 is a circuit diagram of a fifth embodiment of the arbitrary stage in FIG. 3.

The arbitrary stage, for example, the nth stage ST_n includes a first set node Q1, a second set node Q2, a reset node QB, a scan output terminal SOT, a carry output terminal COT, a first control switching device cTr1, a second control switching device cTr2, a node controller NC, a carry output unit COU, and a scan output unit SOU, as shown in FIG. 9.

The node controller NC in FIG. 9 is the same in configuration as that in FIG. 4, stated above, and a description thereof will thus be replaced by the above description given with reference to FIG. 4.

The scan pull-up switching device Spu of the nth stage ST_n is controlled by a voltage at the first set node Q1 and is connected between any one scan clock transfer line and the scan output terminal SOT of the nth stage ST_n. That is, the scan pull-up switching device Spu is turned on or off in response to the voltage at the first set node Q1, and interconnects the scan clock transfer line and the scan output terminal SOT when turned on. Here, the nth stage ST_n has j scan clock transfer lines, which transfer j scan clock pulses, respectively.

The scan pull-down switching device Spd of the nth stage ST_n is controlled by the voltage at the reset node QB and is connected between the scan output terminal SOT of the nth stage ST_n and a first discharging voltage line. That is, the scan pull-down switching device Spd is turned on or off in response to the voltage at the reset node QB, and interconnects the scan output terminal SOT of the nth stage ST_n and the first discharging voltage line when turned on. Here, the first discharging voltage line transfers a first discharging voltage VSS1.

The first control switching device cTr1 of the nth stage ST_n is controlled by the voltage at the first set node Q1 and is connected between the first set node Q1 and the second set node Q2. That is, the first control switching device cTr1 is turned on or off in response to the voltage at the first set node Q1, and interconnects the first set node Q1 and the second set node Q2 when turned on.

The second control switching device cTr2 of the nth stage ST_n is controlled by the voltage at the reset node QB and is connected between the second set node Q2 and a fifth discharging voltage line. That is, the second control switching device cTr2 is turned on or off in response to the voltage at the reset node QB, and interconnects the second set node Q2 and the fifth discharging voltage line when turned on. The fifth discharging voltage line transfers a fifth discharging voltage VSS5.

Alternatively, the second control switching device cTr2 may be connected to any one carry clock transfer line instead of the reset node QB. In this case, a carry clock pulse applied to the second control switching device cTr2 does not overlap with a carry clock pulse applied to the carry pull-up switching device Cpu of the same stage, which will be described later in more detail.

On the other hand, the first and second control switching devices cTr1 and cTr2 may be formed in any one of the node controller NC, the carry output unit COU and the scan output unit SOU.

The carry pull-up switching device Cpu of the nth stage ST_n is controlled by a voltage at the second set node Q2 and is connected between any one carry clock transfer line and the carry output terminal COT of the nth stage ST_n. That is, the carry pull-up switching device Cpu is turned on or off in response to the voltage at the second set node Q2, and interconnects the carry clock transfer line and the carry output terminal COT of the nth stage ST_n when turned on. Here, the nth stage ST_n has i carry clock transfer lines, which transfer i carry clock pulses, respectively.

The carry pull-down switching device Cpd of the nth stage ST_n is controlled by the voltage at the reset node QB and is connected between the carry output terminal COT of the nth stage ST_n and a second discharging voltage line. That is, the carry pull-down switching device Cpd is turned on or off in response to the voltage at the reset node QB, and interconnects the carry output terminal COT of the nth stage ST_n and the second discharging voltage line when turned on. Here, the carry pull-down switching device Cpd in FIG. 9 may be configured in a manner as shown in FIG. 8.

On the other hand, the inverter INV in FIG. 9 may have any one of the above-stated configurations proposed in FIGS. 5A to 5C.

Figure 10:
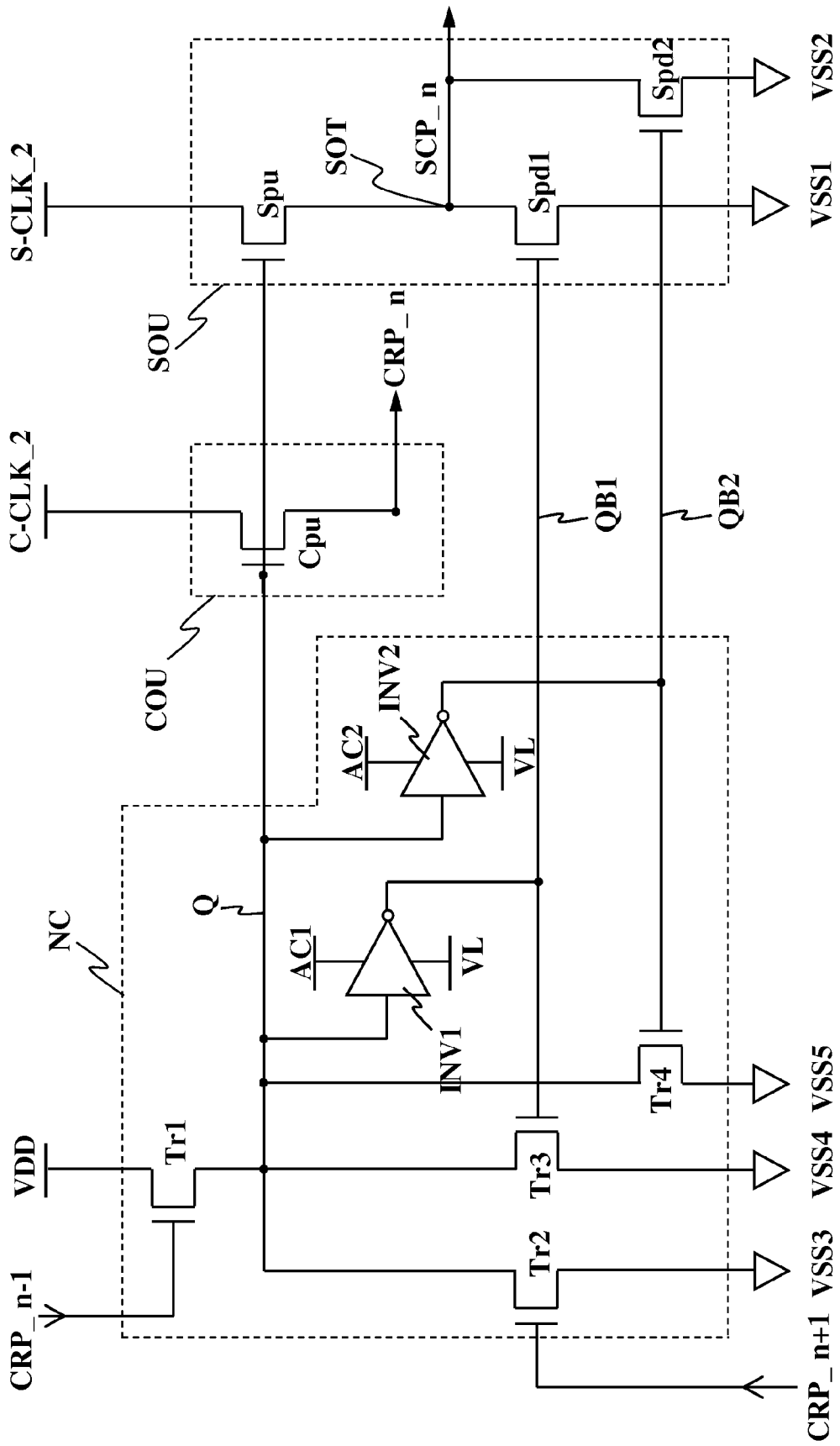
FIG. 10 is a circuit diagram of a sixth embodiment of the arbitrary stage in FIG. 3.

FIG. 10 is a circuit diagram of a sixth embodiment of the arbitrary stage in FIG. 3.

The arbitrary stage, for example, the nth stage ST_n includes a set node Q, a first reset node QB1, a second reset node QB2, a scan output terminal SOT, a carry output terminal COT, a node controller NC, a carry output unit COU, and a scan output unit SOU, as shown in FIG. 10.

The node controller NC of the nth stage ST_n controls voltages at the set node Q, first reset node QB1 and second reset node QB2 in response to a carry pulse CRP_n−1 from an upstream stage and a carry pulse CRP_n+1 from a downstream stage. To this end, the node controller NC of the nth stage ST_n includes first to fourth switching devices Tr1 to Tr4, and first and second inverters INV1 and INV2, as shown in FIG. 10.

The carry output unit COU of the nth stage ST_n includes a carry pull-up switching device Cpu, as shown in FIG. 10. The carry output unit COU in FIG. 10 is the same in configuration as that in FIG. 4, stated above, and a description thereof will thus be replaced by the above description given with reference to FIG. 4.

The scan output unit SOU of the nth stage ST_n includes a scan pull-up switching device Spu, a first scan pull-down switching device Spd1, and a second scan pull-down switching device Spd2, as shown in FIG. 10.

Hereinafter, a detailed description will be given of the functions of the first switching device Tr1, second switching device Tr2, third switching device Tr3, fourth switching device Tr4, carry pull-up switching device Cpu, scan pull-up switching device Spu, first scan pull-down switching device Spd1, second scan pull-down switching device Spd2, first inverter INV1 and second inverter INV2 provided in the nth stage ST_n.

The first switching device Tr1 of the nth stage ST_n is the same as that in FIG. 4, stated above, and a description thereof will thus be replaced by the above description given with reference to FIG. 4.

The second switching device Tr2 of the nth stage ST_n is the same as that in FIG. 4, stated above, and a description thereof will thus be replaced by the above description given with reference to FIG. 4.

The third switching device Tr3 of the nth stage ST_n is controlled by the voltage at the first reset node QB1 and is connected between the set node Q and a fourth discharging voltage line. That is, the third switching device Tr3 is turned on or off in response to the voltage at the first reset node QB1, and interconnects the set node Q and the fourth discharging voltage line when turned on.

The fourth switching device Tr4 of the nth stage ST_n is controlled by the voltage at the second reset node QB2 and is connected between the set node Q and a fifth discharging voltage line. That is, the fourth switching device Tr4 is turned on or off in response to the voltage at the second reset node QB2, and interconnects the set node Q and the fifth discharging voltage line when turned on. The fifth discharging voltage line transfers a fifth discharging voltage VSS5.

The first inverter INV1 of the nth stage ST_n applies a low voltage VL to the first reset node QB1 when the voltage at the set node Q is logic high. In contrast, when the voltage at the set node Q is logic low, the first inverter INV1 of the nth stage ST_n applies a first alternating current (AC) voltage AC1 to the first reset node QB1.

The second inverter INV2 of the nth stage ST_n applies the low voltage VL to the second reset node QB2 when the voltage at the set node Q is logic high. In contrast, when the voltage at the set node Q is logic low, the second inverter INV2 of the nth stage ST_n applies a second AC voltage AC2 to the second reset node QB2.

Here, each of the first AC voltage AC1 and second AC voltage AC2 is an AC signal which alternately has a high voltage and a low voltage at intervals of a frames (where a is a natural number). The first AC voltage AC1 is 180° phase-inverted with respect to the second AC voltage AC2. In this regard, provided that the first AC voltage AC1 is kept at the high voltage for a specific frame period, the second AC voltage AC2 will be kept at the low voltage for the same period.

The carry pull-up switching device Cpu of the nth stage ST_n is the same as that in FIG. 4, stated above, and a description thereof will thus be replaced by the above description given with reference to FIG. 4.

The scan pull-up switching device Spu of the nth stage ST_n is the same as that in FIG. 4, stated above, and a description thereof will thus be replaced by the above description given with reference to FIG. 4.

The first scan pull-down switching device Spd1 of the nth stage ST_n is controlled by the voltage at the first reset node QB1 and is connected between the scan output terminal SOT of the nth stage ST_n and a first discharging voltage line. That is, the first scan pull-down switching device Spd1 is turned on or off in response to the voltage at the first reset node QB1, and interconnects the scan output terminal SOT of the nth stage ST_n and the first discharging voltage line when turned on.

The second scan pull-down switching device Spd2 of the nth stage ST_n is controlled by the voltage at the second reset node QB2 and is connected between the scan output terminal SOT of the nth stage ST_n and a second discharging voltage line. That is, the second scan pull-down switching device Spd2 is turned on or off in response to the voltage at the second reset node QB2, and interconnects the scan output terminal SOT of the nth stage ST_n and the second discharging voltage line when turned on.

Figure 11:
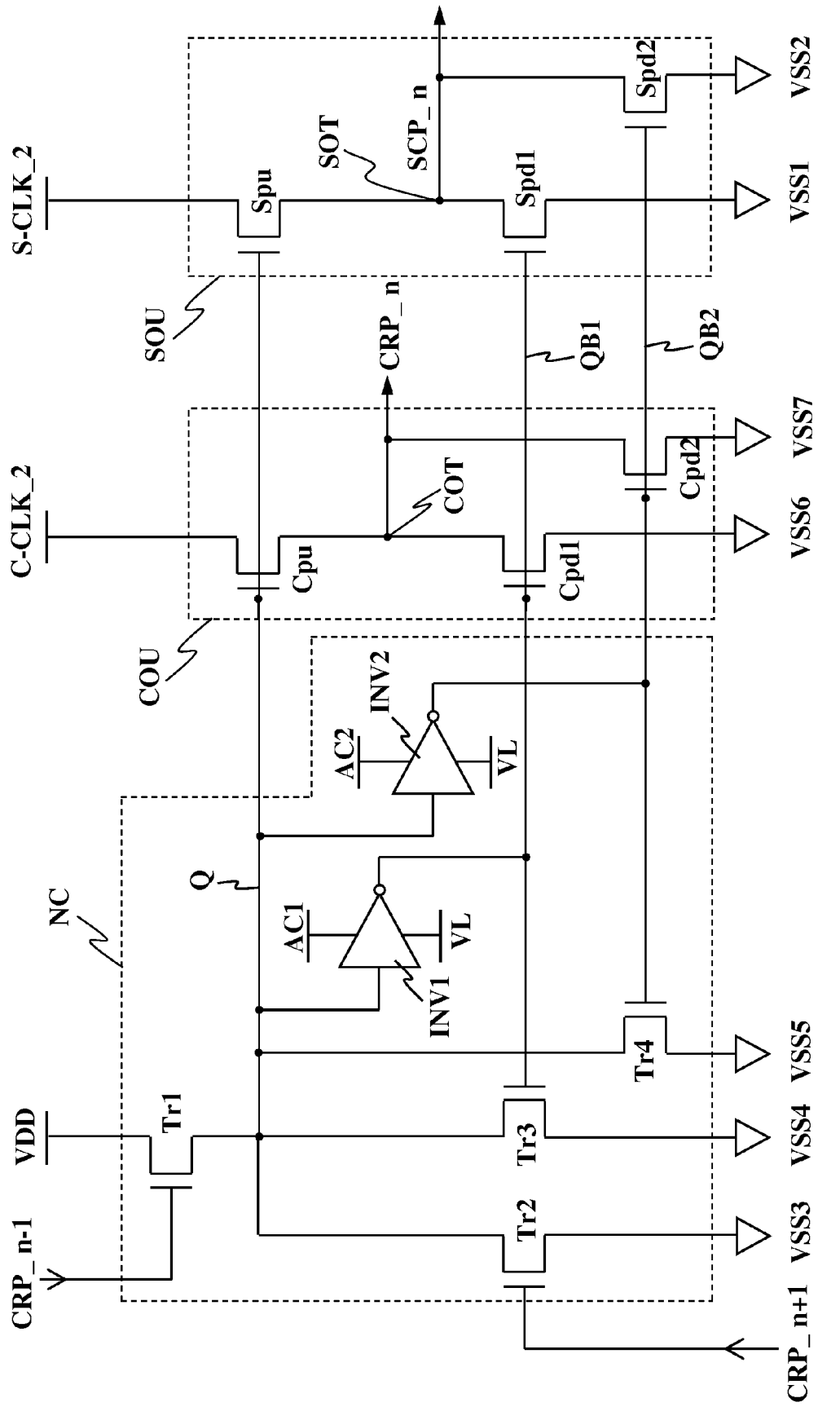
FIG. 11 is a circuit diagram of a seventh embodiment of the arbitrary stage in FIG. 3.

FIG. 11 is a circuit diagram of a seventh embodiment of the arbitrary stage in FIG. 3.

The arbitrary stage, for example, the nth stage ST_n includes a set node Q, a first reset node QB1, a second reset node QB2, a scan output terminal SOT, a carry output terminal COT, a node controller NC, a carry output unit COU, and a scan output unit SOU, as shown in FIG. 11.

The node controller NC and scan output unit SOU in FIG. 11 are the same as those in FIG. 10, stated above, and a description thereof will thus be replaced by the above description given with reference to FIG. 10.

The carry output unit COU in FIG. 11 further includes a first carry pull-down switching device Cpd1 and a second carry pull-down switching device Cpd2, as compared with that in FIG. 10.

The first carry pull-down switching device Cpd1 of the nth stage ST_n is controlled by the voltage at the first reset node QB1 and is connected between the carry output terminal COT of the nth stage ST_n and a sixth discharging voltage line. That is, the first carry pull-down switching device Cpd1 is turned on or off in response to the voltage at the first reset node QB1, and interconnects the carry output terminal COT of the nth stage ST_n and the sixth discharging voltage line when turned on. Here, the sixth discharging voltage line transfers a sixth discharging voltage VSS6.

The second carry pull-down switching device Cpd2 of the nth stage ST_n is controlled by the voltage at the second reset node QB2 and is connected between the carry output terminal COT of the nth stage ST_n and a seventh discharging voltage line. That is, the second carry pull-down switching device Cpd2 is turned on or off in response to the voltage at the second reset node QB2, and interconnects the carry output terminal COT of the nth stage ST_n and the seventh discharging voltage line when turned on. Here, the seventh discharging voltage line transfers a seventh discharging voltage VSS7.

On the other hand, the first to seventh discharging voltages VSS1 to VSS7 in all the embodiments described above have levels capable of turning off the above-stated switching devices (first to fourth switching devices Tr1 to Tr4, carry pull-up switching device Cpu, scan pull-up switching device Spu, carry pull-down switching device Cpd, scan pull-down switching device Spd, first carry pull-down switching device Cpd1, first scan pull-down switching device Spd1, second carry pull-down switching device Cpd2, second scan pull-down switching device Spd2, first to fifth inverting switching devices iTr1 to iTr5, and first and second control switching devices cTr1 and cTr2), which may be the same or different. Also, the low voltage VL, the low voltage of the first AC voltage AC1 and the low voltage of the second AC voltage AC2, described above, have levels capable of turning off the above-stated switching devices, too.

In contrast, the charging voltage VDD, the high voltage VH, the high voltage of the first AC voltage AC1 and the high voltage of the second AC voltage AC2 all have levels capable of turning on the above-stated switching devices.

On the other hand, in FIG. 11, the first discharging voltage VSS1, the second discharging voltage VSS2, the sixth discharging voltage VSS6 and the seventh discharging voltage VSS7 all have the same levels, which may be higher than or equal to the level of the above-stated low voltage VL (VSS1=VSS2=VSS6=VSS7≧VL). Also, the third discharging voltage VSS3, the fourth discharging voltage VSS4 and the fifth discharging voltage VSS5 all have the same levels, which may be higher than or equal to the level of the low voltage VL (VSS3=VSS4=VSS5≧VL).

Alternatively, in FIG. 11, the first discharging voltage VSS1, the second discharging voltage VSS2, the sixth discharging voltage VSS6, the seventh discharging voltage VSS7, the third discharging voltage VSS3, the fourth discharging voltage VSS4 and the fifth discharging voltage VSS5 may all have the same levels, which may be higher than or equal to the level of the low voltage VL (VSS1=VSS2=VSS6=VSS7=VSS3=VSS4=VSS5≧VL).

On the other hand, the above level relationship between the discharging voltages VSS1 to VSS7 and the low voltage VL is applicable to all the above-stated embodiments, as well as the embodiment of FIG. 11.

Figure 12:
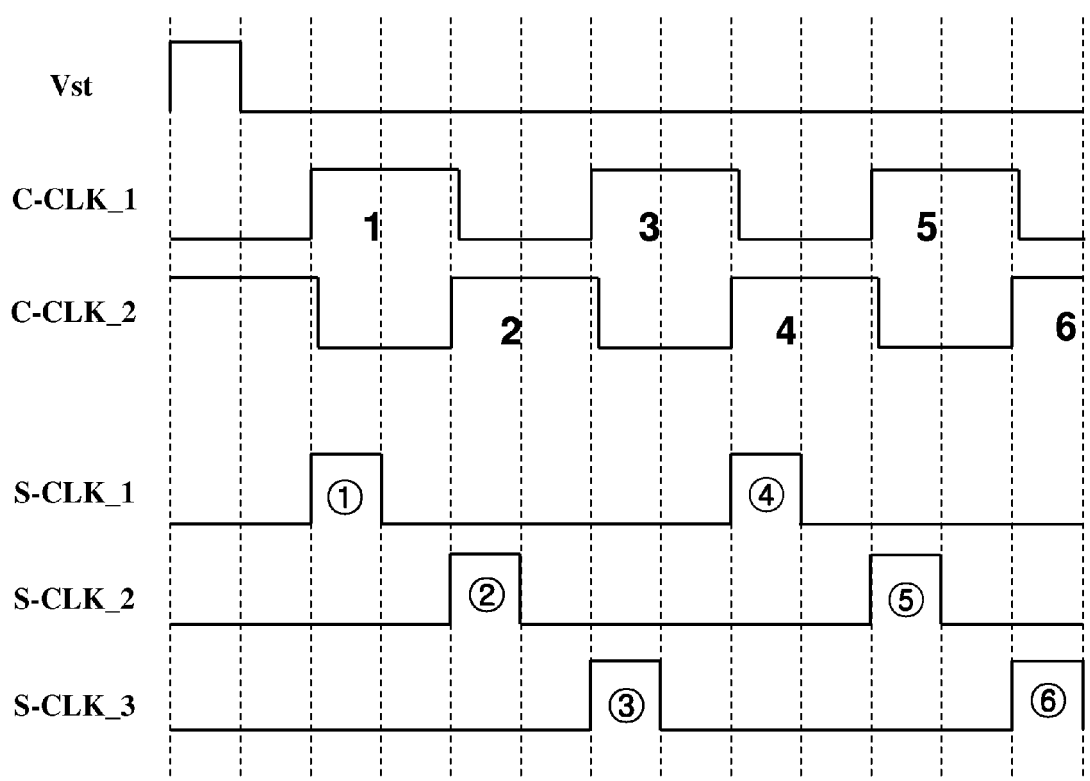
FIG. 12 is an output timing diagram illustrating carry clock pulses and scan clock pulses of another example output from the carry clock generator and scan clock generator in FIG. 1.

FIG. 12 is an output timing diagram illustrating carry clock pulses and scan clock pulses of another example output from the carry clock generator and scan clock generator in FIG. 1.

As shown in FIG. 12, carry clock pulses C-CLK_1 and C-CLK_2 of two phases may be generated from the carry clock generator CCG, and scan clock pulses S-CLK_1, S-CLK_2 and S-CLK_3 of three phases may be generated from the scan clock generator SCG. In this case, the first carry clock pulse C-CLK_1 is ahead in phase of the second carry clock pulse C-CLK_2. The first carry clock pulse C-CLK_1 includes a plurality of carry impulses 1, 3, 5, . . . which are periodically output, and the second carry clock pulse C-CLK_2 likewise includes a plurality of carry impulses 2, 4, 6, . . . which are periodically output.

FIG. 12 shows the scan clock pulses S-CLK_1, S-CLK_2 and S-CLK_3 of the three phases, in which the first scan clock pulse S-CLK_1 is ahead in phase of the second scan clock pulse S-CLK_2 and the second scan clock pulse S-CLK_2 is ahead in phase of the third scan clock pulse S-CLK_3. The first scan clock pulse S-CLK_1 includes a plurality of scan impulses ①, ④, . . . which are periodically output, the second scan clock pulse S-CLK_2 likewise includes a plurality of scan impulses ②, ⑤, . . . which are periodically output, and the third scan clock pulse S-CLK_3 likewise includes a plurality of scan impulses ③, ⑥, . . . which are periodically output.

Here, the scan impulses included in each of the above three scan clock pulses S-CLK_1 to S-CLK_3 are synchronized with carry impulses included in at least one carry clock pulse, respectively. In detail, each scan impulse in a scan clock pulse output in the kth order (where k is any one of natural numbers from 1 to j), among j scan clock pulses, is synchronized with a carry impulse output in the (jm+k)th order (where m is a natural number including 0), among carry impulses in i carry clock pulses. A more detailed description will hereinafter be given with reference to an example.

That is, assuming that i and j are set respectively to 2 and 3 as shown in FIG. 12, the above expression 'jm+k' is defined as '3m+k', where k is any one of natural numbers from 1 to 3. In this case, the scan clock pulse S-CLK_1 output in the first order (i.e., k=1), among the three scan clock pulses S-CLK_1 to S-CLK_3, is synchronized with a carry impulse output in the '(3m+1)th' order. In other words, the scan clock pulse S-CLK_1 output in the first order includes the scan impulses ①, ④, . . . which are synchronized with the carry impulses 1, 4, . . . sequentially output in the (3m+1)th order, respectively.

In the same manner, the scan clock pulse S-CLK_2 output in the second order (i.e., k=2), among the three scan clock pulses S-CLK_1 to S-CLK_3, is synchronized with a carry impulse output in the '(3m+2)th' order. In other words, the scan clock pulse S-CLK_2 output in the second order includes the scan impulses ②, ⑤, . . . which are synchronized with the carry impulses 2, 5, . . . sequentially output in the (3m+2)th order, respectively.

In the same manner, the scan clock pulse S-CLK_3 output in the third order (i.e., k=3), among the three scan clock pulses S-CLK_1 to S-CLK_3, is synchronized with a carry impulse output in the '(3m+3)th' order. In other words, the scan clock pulse S-CLK_3 output in the third order includes the scan impulses ③, ⑥, . . . which are synchronized with the carry impulses 3, 6, . . . sequentially output in the (3m+3)th order, respectively.

Figure 13:
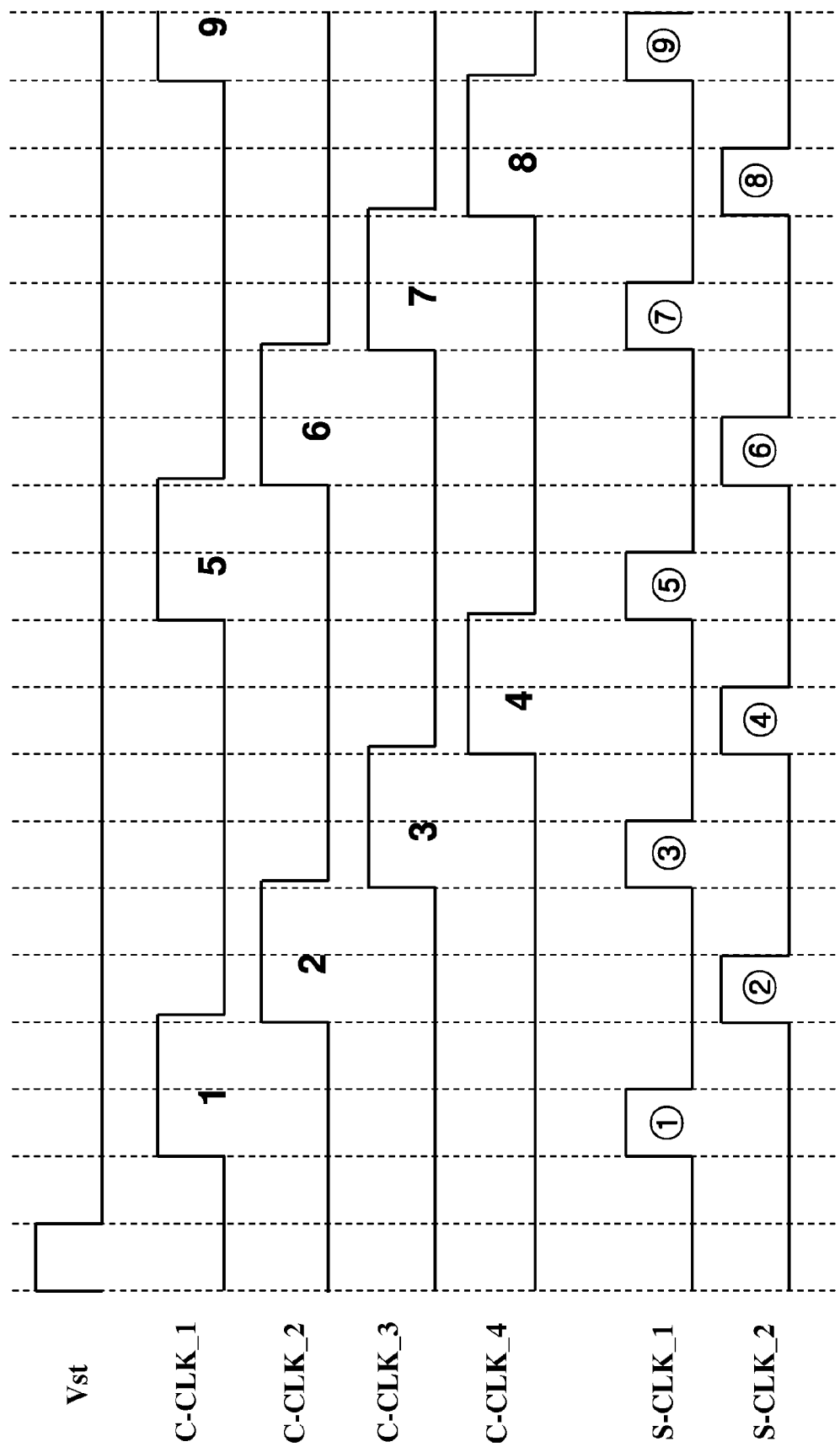
FIG. 13 is an output timing diagram illustrating carry clock pulses and scan clock pulses of another example output from the carry clock generator and scan clock generator in FIG. 1.

FIG. 13 is an output timing diagram illustrating carry clock pulses and scan clock pulses of another example output from the carry clock generator and scan clock generator in FIG. 1.

As shown in FIG. 13, carry clock pulses C-CLK_1, C-CLK_2, C-CLK_3 and C-CLK_4 of four phases may be generated from the carry clock generator CCG, and scan clock pulses S-CLK_1 and S-CLK_2 of two phases may be generated from the scan clock generator SCG. In this case, the first carry clock pulse C-CLK_1 is ahead in phase of the second carry clock pulse C-CLK_2, the second carry clock pulse C-CLK_2 is ahead in phase of the third carry clock pulse C-CLK_3, and the third carry clock pulse C-CLK_3 is ahead in phase of the fourth carry clock pulse C-CLK_4. The first carry clock pulse C-CLK_1 includes a plurality of carry impulses 1, 5, 9, . . . which are periodically output, the second carry clock pulse C-CLK_2 likewise includes a plurality of carry impulses 2, 6, which are periodically output, the third carry clock pulse C-CLK_3 likewise includes a plurality of carry impulses 3, 7, which are periodically output, and the fourth carry clock pulse C-CLK_4 likewise includes a plurality of carry impulses 4, 8, . . . which are periodically output.

FIG. 13 shows the scan clock pulses S-CLK_1 and S-CLK_2 of the two phases, in which the first scan clock pulse S-CLK_1 is ahead in phase of the second scan clock pulse S-CLK_2. The first scan clock pulse S-CLK_1 includes a plurality of scan impulses ①, ③, ⑤, . . . which are periodically output, and the second scan clock pulse S-CLK_2 likewise includes a plurality of scan impulses ②, ④, ⑥, . . . which are periodically output.

Here, the scan impulses included in each of the above two scan clock pulses S-CLK_1 and S-CLK_2 are synchronized with carry impulses included in at least one carry clock pulse, respectively. In detail, each scan impulse in a scan clock pulse output in the kth order (where k is any one of natural numbers from 1 to j), among j scan clock pulses, is synchronized with a carry impulse output in the (jm+k)th order (where m is a natural number including 0), among carry impulses in i carry clock pulses. A more detailed description will hereinafter be given with reference to an example.

That is, assuming that i and j are set respectively to 4 and 2 as shown in FIG. 13, the above expression 'jm+k' is defined as '2m+k', where k is any one of natural numbers from 1 to 2. In this case, the scan clock pulse S-CLK_1 output in the first order (i.e., k=1), of the two scan clock pulses S-CLK_1 and S-CLK_2, is synchronized with a carry impulse output in the '(2m+1)th' order. In other words, the scan clock pulse S-CLK_1 output in the first order includes the scan impulses ①, ③, ⑤, . . . which are synchronized with the carry impulses 1, 3, 5, . . . sequentially output in the (2m+1)th order, respectively.

In the same manner, the scan clock pulse S-CLK_2 output in the second order (i.e., k=2), of the two scan clock pulses S-CLK_1 and S-CLK_2, is synchronized with a carry impulse output in the '(2m+2)th' order. In other words, the scan clock pulse S-CLK_2 output in the second order includes the scan impulses ②, ④, ⑥, . . . which are synchronized with the carry impulses 2, 4, 6, . . . sequentially output in the (2m+2)th order, respectively.

On the other hand, the carry clock pulse applied to the carry pull-down switching device Cpd in FIG. 8 does not overlap with the carry clock pulse applied to the carry pull-up switching device Cpu of the same stage. For example, when the first carry clock pulse is supplied to the carry pull-down switching device Cpd in FIG. 8, the third carry clock pulse may be supplied to the carry pull-up switching device Cpu in the same drawing.

On the other hand, in all embodiments, the scan pull-up switching device Spu may have a channel width set to be larger than that of the carry pull-up switching device Cpu. The reason is that the scan pull-up switching device Spu is connected to a larger load than the carry pull-up switching device Cpu. That is, the carry pull-up switching device Cpu is connected only to adjacent stages, whereas the scan pull-up switching device Spu is connected to a large load, which is a display panel, through a gate line.

Also, in the embodiments in which the carry pull-up switching device Cpu, the carry pull-down switching device Cpd, the scan pull-up switching device Spu and the scan pull-down switching device Spd are all provided in one stage, among all the above-stated embodiments, assuming that the channel width of the carry pull-up switching device Cpu is W1, the channel width of the carry pull-down switching device Cpd is W2, the channel width of the scan pull-up switching device Spu is W3 and the channel width of the scan pull-down switching device Spd is W4, W1 to W4 may be set to such values as to satisfy an equation of $(W4/W3)<(W2/W1)$.

On the other hand, in all embodiments, the upstream stage may be any one of stages positioned upstream of the arbitrary stage. For example, assuming that the arbitrary stage is the nth stage ST_n, the upstream stage may be an (n−x)th stage, where x is a natural number less than n. Also, the downstream stage may be any one of stages positioned downstream of the arbitrary stage. For example, assuming that the arbitrary stage is the nth stage ST_n, the downstream stage may be an (n+y) th stage, where y is a natural number. In this case, x and y may be the same or different.

As is apparent from the above description, the present invention has effects as follows.

According to the present invention, even though the duty ratio of a scan pulse is so small that a low duration is generated between the scan pulse and a scan pulse output in an adjacent period, it is possible to prevent a voltage at a set node of a corresponding stage from falling in a set period of the stage. Therefore, the scan pulse can be stably generated in an output period of the stage.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages for sequentially generating outputs thereof, wherein each of the stages comprises:
   a set node;
   a reset node;
   a node controller controlling voltages at the set node and reset node in response to a carry pulse from an upstream stage and a carry pulse from a downstream stage;
   a carry output unit being controlled by the voltage at the set node and outputting the carry pulse to drive at least one of the downstream stage and the upstream stage; and
   a scan output unit being controlled by the voltages at the set node and the reset node, and outputting a scan pulse to drive a gate line,
   wherein the node controller of each of the stages comprises:
   a first switching device controlled by the carry pulse from the upstream stage and connected between a charging voltage line and the set node;
   a second switching device controlled by the carry pulse from the downstream stage and connected between the set node and a discharging voltage line;
   a third switching device controlled by the voltage at the reset node and connected between the set node and the discharging voltage line; and
   an inverter controlling the voltage at the reset node in response to the voltage at the set node,
   wherein each of the outputs generated from the stages comprises the carry pulse and the scan pulse, the carry pulse and the scan pulse being paired to correspond to each other, and
   wherein the paired carry pulse and scan pulse have different durations.

2. The shift register according to claim 1, wherein the duration of the carry pulse is longer than the duration of the scan pulse.

3. The shift register according to claim 1, wherein each of the stages receives at least one of i carry clock pulses, the i carry clock pulses being out of phase with one another, and at least one of j scan clock pulses, the j scan clock pulses being out of phase with one another,
   wherein the carry output unit generates and outputs the carry pulse based on the at least one carry clock pulse, and
   wherein the scan output unit generates and outputs the scan pulse based on the at least one scan clock pulse.

4. The shift register according to claim 3, wherein:
   each of the i carry clock pulses comprises a plurality of carry impulses, the carry impulses being periodically output; and
   each of the j scan clock pulses comprises a plurality of scan impulses, the scan impulses being periodically output,
   wherein the scan impulses in each of the j scan clock pulses are synchronized with carry impulses in at least one of the i carry clock pulses, respectively.

5. The shift register according to claim 4, wherein each scan impulse in a scan clock pulse output in the kth order (where k is any one of natural numbers from 1 to j), among the j scan clock pulses, is synchronized with a carry impulse output in the (jm+k)th order (where m is a natural number including 0), among the carry impulses in the i carry clock pulses.

6. The shift register according to claim 4, wherein each of the carry impulses has a duration longer than that of each of the scan impulses.

7. The shift register according to claim 4, wherein, in a carry impulse and a scan impulse synchronized with each other, the carry impulse has a rising edge being ahead of or behind that of the scan impulse or coinciding with that of the scan impulse, and a falling edge being behind that of the scan impulse.

8. The shift register according to claim 3,
   wherein the carry output unit comprises a carry pull-up switching device controlled by the voltage at the set node and connected between a carry clock transfer line transferring any one of the carry clock pulses and a carry output terminal, and
   wherein the scan output unit comprises a scan pull-up switching device controlled by the voltage at the set node and connected between a scan clock transfer line transferring any one of the scan clock pulses and a scan output terminal.

9. The shift register according to claim 8, wherein each of the stages further comprises a capacitor connected between the set node and the carry output terminal.

10. The shift register according to claim 8, wherein the carry output unit of each of the stages further comprises a carry pull-down switching device controlled by the voltage at the reset node or any one of the carry clock pulses and connected between the carry output terminal and a second discharging voltage line, the second discharging voltage line transferring a second discharging voltage.

11. The shift register according to claim 8, wherein the scan output unit further comprises a scan pull-down switching device controlled by the voltage at the reset node and connected between the scan output terminal and the discharging voltage line.

12. The shift register according to claim 8, wherein the inverter of each of the stages comprises:
   a first inverting switching device controlled by a high voltage from a high voltage line and connected between the high voltage line and the reset node;
   a second inverting switching device controlled by the voltage at the set node and connected between the reset node and a low voltage line, the low voltage line transferring a low voltage; and
   a third inverting switching device controlled by the carry pulse from the upstream stage and connected between the reset node and the low voltage line.

13. The shift register according to claim 8, wherein the inverter of each of the stages comprises:
   a first inverting switching device controlled by an external control signal and connected between a high voltage line, the high voltage line transferring a high voltage, and the reset node;
   a second inverting switching device controlled by the voltage at the set node and connected between the reset node and a low voltage line, the low voltage line transferring a low voltage; and
   a third inverting switching device controlled by the carry pulse from the upstream stage and connected between the reset node and the low voltage line.

14. The shift register according to claim 8, wherein the inverter of each of the stages comprises:
   a first inverting switching device controlled by a high voltage from a high voltage line and connected between the high voltage line and a common node;
   a second inverting switching device controlled by the voltage at the set node and connected between the common node and a low voltage line, the low voltage line transferring a low voltage;

a third inverting switching device controlled by a voltage at the common node and connected between the high voltage line and the reset node;

a fourth inverting switching device controlled by the voltage at the set node and connected between the reset node and the low voltage line; and a fifth inverting switching device controlled by the carry pulse from the upstream stage and connected between the reset node and the low voltage line.

15. A shift register comprising a plurality of stages for sequentially generating outputs thereof, wherein each of the stages comprises:

a first set node;

a second set node;

a reset node;

a first control switching device being controlled by a voltage at the first set node and controlling the second set node;

a second control switching device being controlled by a voltage at the reset node and being connected between the second set node and a discharging voltage line;

a node controller controlling voltages at the first set node and reset node in response to a carry pulse from the upstream stage and a carry pulse from the downstream stage;

a carry output unit being controlled by voltages at the second set node and the reset node, and outputting the carry pulse to drive at least one of a downstream stage and an upstream stage; and a scan output unit being controlled by voltages at the first set node and the reset node and outputting a scan pulse to drive a gate line; wherein the pair carry pulse and scan pulse have different durations.

16. The shift register according to claim 15, wherein the carry output unit comprises a carry pull-up switching device controlled by the voltage at the second set node and connected between a carry clock transfer line transferring any one of a plurality of carry clock pulses and a carry output terminal, and a carry pull-down switching device controlled by the voltage at the reset node and connected between the carry output terminal and a discharging voltage line, and wherein the scan output unit comprises a scan pull-up switching device controlled by the voltage at the first set node and connected between a scan clock transfer line transferring any one of a plurality of scan clock pulses and a scan output terminal, and a scan pull-down switching device controlled by the voltage at the reset node and connected between the scan output terminal and the discharging voltage line.

17. The shift register according to claim 16, wherein a channel width of the carry pull-up switching device is W1, a channel width of the carry pull-down switching device is W2, a channel width of the scan pull-up switching device is W3 and a channel width of the scan pull-down switching device is W4, W1 to W4 are set to such values as to satisfy an equation of (W4/W3)<(W2/W1).

18. The shift register according to claim 8 or 16, wherein the scan pull-up switching device has a channel width larger than that of the carry pull-up switching device.

19. The shift register according to claim 15, wherein the node controller of each of the stages comprises:

a first switching device controlled by the carry pulse from the upstream stage and connected between a charging voltage line and the first set node;

a second switching device controlled by the carry pulse from the downstream stage and connected between the first set node and the discharging voltage line;

a third switching device controlled by the voltage at the reset node and connected between the first set node and the discharging voltage line; and an inverter controlling the voltage at the reset node in response to the voltage at the first set node.

\* \* \* \* \*